(12) United States Patent
Wada

(10) Patent No.: US 11,778,352 B2
(45) Date of Patent: Oct. 3, 2023

(54) IMAGING APPARATUS AND ELECTRONIC DEVICE

(71) Applicant: Sony Semiconductor Solutions Corporation, Kanagawa (JP)

(72) Inventor: Kimitaka Wada, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 177 days.

(21) Appl. No.: 17/261,340

(22) PCT Filed: Aug. 2, 2019

(86) PCT No.: PCT/JP2019/030414
§ 371 (c)(1),
(2) Date: Jan. 19, 2021

(87) PCT Pub. No.: WO2020/036078
PCT Pub. Date: Feb. 20, 2020

(65) Prior Publication Data
US 2021/0266489 A1 Aug. 26, 2021

(30) Foreign Application Priority Data
Aug. 17, 2018 (JP) .................................. 2018-153661

(51) Int. Cl.
*H04N 25/79* (2023.01)
*H01L 27/146* (2006.01)
(Continued)

(52) U.S. Cl.
CPC ....... *H04N 25/79* (2023.01); *H01L 27/14634* (2013.01); *H04N 25/616* (2023.01); *H04N 25/75* (2023.01)

(58) Field of Classification Search
CPC ...... H04N 25/616; H04N 25/75; H04N 25/79; H01L 27/14612; H01L 27/14634
See application file for complete search history.

(56) References Cited

U.S. PATENT DOCUMENTS

2015/0281539 A1 10/2015 Ueki et al.
2015/0381918 A1 12/2015 Mabuchi
(Continued)

FOREIGN PATENT DOCUMENTS

JP 2009-17720 A 1/2009
JP 2014-103543 A 6/2014
(Continued)

OTHER PUBLICATIONS

International Search Report (PCT/ISA/210), International Application No. PCT/JP2019/030414, dated Oct. 4, 2019.
(Continued)

*Primary Examiner* — Lin Ye
*Assistant Examiner* — Chriss S Yoder, III
(74) *Attorney, Agent, or Firm* — Michael Best & Friedrich LLP

(57) ABSTRACT

An imaging apparatus and an electronic device with reduced size are disclosed. In one example, an imaging apparatus includes pixel circuits, an AD converter, an encoding unit, a holding unit, and an output unit. The pixel circuits output an electric charge signal generated from incident light. The AD converter compares the electric charge signal with a reference signal for each of the pixel circuits, and outputs, as a conversion result, a code input signal at a time when a comparison result has been inverted. The encoding unit encodes the conversion result from the AD converter. The holding unit holds an encoding result. The output unit outputs the encoding result held by the holding unit. The pixel circuits are disposed in a first substrate. The AD converter is disposed in a second substrate that is stacked in a lower layer of the first substrate.

12 Claims, 28 Drawing Sheets

(51) Int. Cl.
*H04N 25/616* (2023.01)
*H04N 25/75* (2023.01)

(56) References Cited

U.S. PATENT DOCUMENTS

| | | | |
|---|---|---|---|
| 2016/0344953 A1* | 11/2016 | Jeong | .................... H04N 25/00 |
| 2017/0214864 A1 | 7/2017 | Izuha et al. | |
| 2018/0175083 A1 | 6/2018 | Takahashi | |
| 2019/0068909 A1* | 2/2019 | Kaibara | ................ H04N 23/73 |

FOREIGN PATENT DOCUMENTS

| | | |
|---|---|---|
| JP | 2014-165520 A | 9/2014 |
| JP | 2016-39393 A | 3/2016 |
| WO | 2016/194653 A1 | 12/2016 |

OTHER PUBLICATIONS

Notification of Transmittal of the International Search Report and the Written Opinion of the International Searching Authority, or the Declaration (PCT/ISA/220), International Application No. PCT/JP2019/030414, dated Oct. 15, 2019.
Written Opinion of the International Search Authority (PCT/ISA/237), International Application No. PCT/JP2019/030414, dated Oct. 15, 2019.

\* cited by examiner

IMAGING APPARATUS AND ELECTRONIC DEVICE

TECHNICAL FIELD

The present technology relates to an imaging apparatus and an electronic device, and relates to, for example, an imaging apparatus and an electronic device that are suitable for a reduction in size.

BACKGROUND ART

In imaging apparatuses in recent years, an increase in the number of pixels, improvements in image quality, and speeding-up are requested, and on the other hand, a further reduction in size is also requested. As an imaging apparatus that satisfies such requests, a stacked-type imaging apparatus has been proposed (see, for example, Patent Document 1).

The stacked-type imaging apparatus has a structure in which a chip in which a signal processing circuit has been formed is used instead of a support substrate of the imaging apparatus and a pixel part is superimposed onto the chip. It has been proposed that an imaging apparatus is reduced in size by employing such a configuration.

CITATION LIST

Patent Document

Patent Document 1: Japanese Patent Application Laid-Open No. 2009-17720

SUMMARY OF THE INVENTION

Problems to be Solved by the Invention

In a stacked-type imaging apparatus, when pixels are microfabricated, the size of a circuit mounted in a chip on which the pixels will be stacked also needs to be reduced. An example of the circuit mounted in the chip is an AD conversion circuit. This AD conversion circuit includes many transistors, and is difficult to reduce in size. It is requested that a chip in which an AD conversion circuit will be mounted be reduced in size and a stacked-type imaging apparatus itself be reduced in size.

The present technology has been created in view of such a situation, and the present technology enables a chip to be reduced in size, and enables a stacked-type imaging apparatus to be reduced in size.

Solutions to Problems

A first imaging apparatus in one aspect of the present technology includes: pixel circuits that each output an electric charge signal generated by receiving incident light and performing optical-to-electrical conversion on the incident light; an AD converter that compares the electric charge signal with a reference signal for each of the pixel circuits, and outputs, as a conversion result, a code input signal at a time when a comparison result has been inverted; an encoding unit that encodes the conversion result from the AD converter; a holding unit that holds the encoding result; and an output unit that outputs the encoding result held by the holding unit. The pixel circuits are disposed in a first substrate. The AD converter is disposed in a second substrate that is stacked in a lower layer of the first substrate.

An electronic device in one aspect of the present technology includes an imaging apparatus and a processing unit. The imaging apparatus includes: pixel circuits that each output an electric charge signal generated by receiving incident light and performing optical-to-electrical conversion on the incident light; an AD converter that compares the electric charge signal with a reference signal for each of the pixel circuits, and outputs, as a conversion result, a code input signal at a time when a comparison result has been inverted; an encoding unit that encodes the conversion result from the AD converter; a holding unit that holds the encoding result; and an output unit that outputs the encoding result held by the holding unit. The pixel circuits are disposed in a first substrate. The AD converter is disposed in a second substrate that is stacked in a lower layer of the first substrate. The processing unit processes a signal from the imaging apparatus.

A second imaging apparatus in one aspect of the present technology includes: pixel circuits that each output an electric charge signal generated by receiving incident light and performing optical-to-electrical conversion on the incident light; an AD converter that compares the electric charge signal with a reference signal for each of the pixel circuits, and outputs, as a conversion result, a code input signal at a time when a comparison result has been inverted; a holding unit that holds the conversion result from the AD converter; and an output unit that outputs the conversion result held by the holding unit. The pixel circuits, and the holding unit or the output unit are disposed in a first substrate. The AD converter is disposed in a second substrate that is stacked in a lower layer of the first substrate.

A third imaging apparatus in one aspect of the present technology includes: pixel circuits that each output an electric charge signal generated by receiving incident light and performing optical-to-electrical conversion on the incident light; an AD converter that compares the electric charge signal with a reference signal for each of the pixel circuits, and outputs, as a conversion result, a code input signal at a time when a comparison result has been inverted; a holding unit that holds the conversion result from the AD converter; and an output unit that outputs the conversion result held by the holding unit. The pixel circuits are disposed in a first substrate. The AD converter is disposed in a second substrate that is stacked in a lower layer of the first substrate. The holding unit and the output unit are disposed in a third substrate that is stacked in a lower layer of the second substrate.

A first imaging apparatus in one aspect of the present technology includes: pixel circuits that each output an electric charge signal generated by receiving incident light and performing optical-to-electrical conversion on the incident light; an AD converter that compares the electric charge signal with a reference signal for each of the pixel circuits, and outputs, as a conversion result, a code input signal at a time when a comparison result has been inverted; an encoding unit that encodes the conversion result from the AD converter; a holding unit that holds an encoding result; and an output unit that outputs the encoding result held by the holding unit. The pixel circuits are disposed in a first substrate. The AD converter is disposed in a second substrate that is stacked in a lower layer of the first substrate.

An electronic device in one aspect of the present technology includes the first imaging apparatus.

A second imaging apparatus in one aspect of the present technology includes: pixel circuits that each output an electric charge signal generated by receiving incident light and performing optical-to-electrical conversion on the incident light; an AD converter that compares the electric charge signal with a reference signal for each of the pixel circuits, and outputs, as a conversion result, a code input signal at a time when a comparison result has been inverted; a holding unit that holds the conversion result from the AD converter; and an output unit that outputs the conversion result held by the holding unit. The pixel circuits, and the holding unit or the output unit are disposed in a first substrate. The AD converter is disposed in a second substrate that is stacked in a lower layer of the first substrate.

A third imaging apparatus in one aspect of the present technology includes: pixel circuits that each output an electric charge signal generated by receiving incident light and performing optical-to-electrical conversion on the incident light; an AD converter that compares the electric charge signal with a reference signal for each of the pixel circuits, and outputs, as a conversion result, a code input signal at a time when a comparison result has been inverted; a holding unit that holds the conversion result from the AD converter; and an output unit that outputs the conversion result held by the holding unit. The pixel circuits are disposed in a first substrate. The AD converter is disposed in a second substrate that is stacked in a lower layer of the first substrate. The holding unit and the output unit are disposed in a third substrate that is stacked in a lower layer of the second substrate.

Note that an imaging apparatus may be an independent apparatus, or may be an internal block that is included in one apparatus. Furthermore, an electronic device may be an independent device, or may be an internal block that is included in one device.

Furthermore, a program can be provided by being transmitted via a transmission medium or by being recorded in a recording medium.

Effects of the Invention

In one aspect of the present technology, a chip can be reduced in size, and a stacked-type imaging apparatus can be reduced in size.

Note that the effect described here is not necessarily restrictive, and any of the effects described in the present disclosure may be exhibited.

MODE FOR CARRYING OUT THE INVENTION

Modes for carrying out the present technology (hereinafter referred to as "embodiments") are described below.

<Schematic Configuration Example of Imaging Apparatus>

Figure 1:
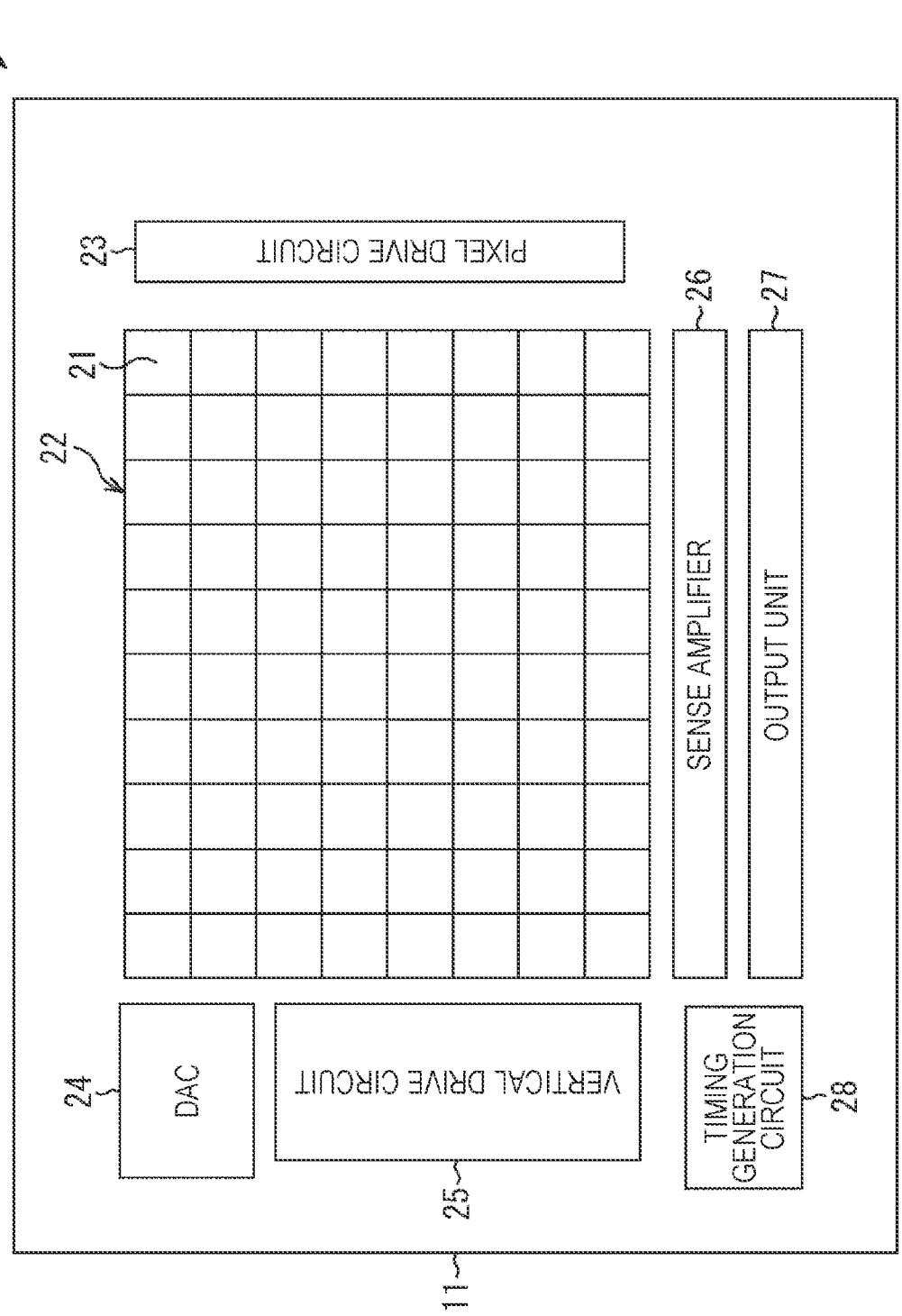
FIG. 1 is a diagram illustrating a schematic configuration of an imaging apparatus according to the present disclosure.

FIG. 1 illustrates a schematic configuration of an imaging apparatus according to the present disclosure.

An imaging apparatus 1 of FIG. 1 includes a pixel array 22 in which pixels 21 have been arranged in a two-dimensional array shape, on a semiconductor substrate 11 that uses, for example, silicon (Si) as a semiconductor. Then, the imaging apparatus 1 includes a pixel drive circuit 23, a D/A converter (DAC) 24, a vertical drive circuit 25, a sense amplifier 26, an output unit 27, and a timing generation circuit 28 in addition to the pixel array 22.

Figure 2:
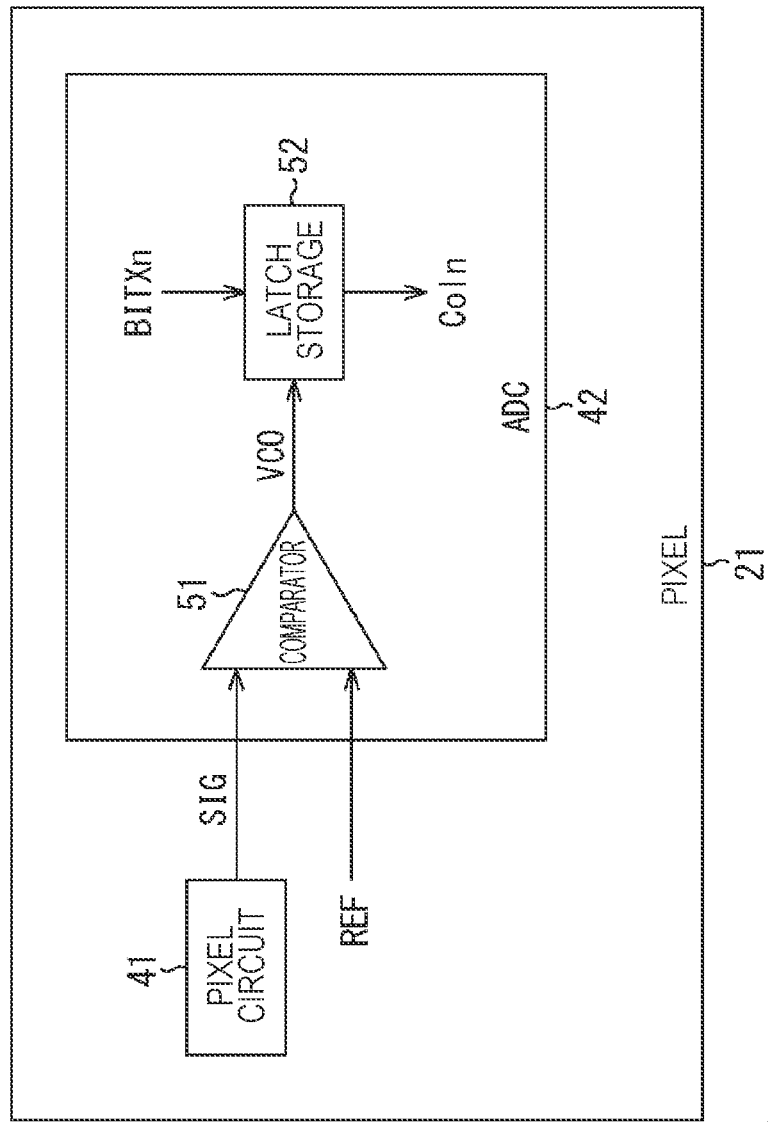
FIG. 2 is a block diagram illustrating a configuration example of a pixel unit.

The pixel 21 includes a pixel circuit 41 and an A/D converter (ADC) 42 inside the pixel 21, as illustrated in FIG. 2. The pixel circuit 41 includes an optical-to-electrical converter that generates and accumulates an electric charge signal that corresponds to an amount of received light, and outputs, to the ADC 42, an analog pixel signal SIG that has been obtained by the optical-to-electrical converter. The ADC 42 converts the analog pixel signal SIG supplied from the pixel circuit 41 into a digital signal.

The ADC 42 includes a comparator 51 and a latch storage 52. The comparator 51 compares a reference signal REF supplied from the DAC 24 with the pixel signal SIG, and outputs an output signal VCO as a signal indicating a comparison result. The comparator 51 inverts the output signal VCO, when the reference signal REF and the pixel signal SIG have become the same as each other (the reference signal REF and the pixel signal SIG have the same voltage).

A code value BITXn (n=an integer ranging from 1 to N) that indicates the current time is input as an input signal to the latch storage 52. Then, the latch storage 52 holds a code value BITXn at the time of inversion of the output signal VCO of the comparator 51, and thereafter, the code value BITXn is read as an output signal CoIn. By doing this, a digital value obtained by digitalizing the analog pixel signal SIG into N bits is output from the ADC 42.

The pixel drive circuit 23 of FIG. 1 drives the pixel circuit 41 and the comparator 51 in the pixel 21. The DAC 24 generates a reference signal REF serving as a slope signal for which a level (a voltage) monotonously decreases according to the lapse of time, and supplies the reference signal REF to each of the pixels 21. The vertical drive circuit 25 outputs a digital pixel signal SIG generated in each of the pixels 21 to the sense amplifier 26 in a predetermined order on the basis of a timing signal supplied from the timing generation circuit 28. The digital pixel signal SIG that has been output from the pixel 21 is amplified by the sense amplifier 26, and is output from the output unit 27 to the outside of the imaging apparatus 1. The output unit 27 performs predetermined digital signal processing, such as black level correction processing for correcting a black level or correlated double sampling (CDS) processing, as needed, and thereafter, the output unit 27 outputs a processed signal to the outside.

The timing generation circuit 28 includes a timing generator that generates various timing signals, or the like, and the timing generation circuit 28 supplies the generated various timing signals to the pixel drive circuit 23, the DAC 24, the vertical drive circuit 25, or the like.

Figure 3:
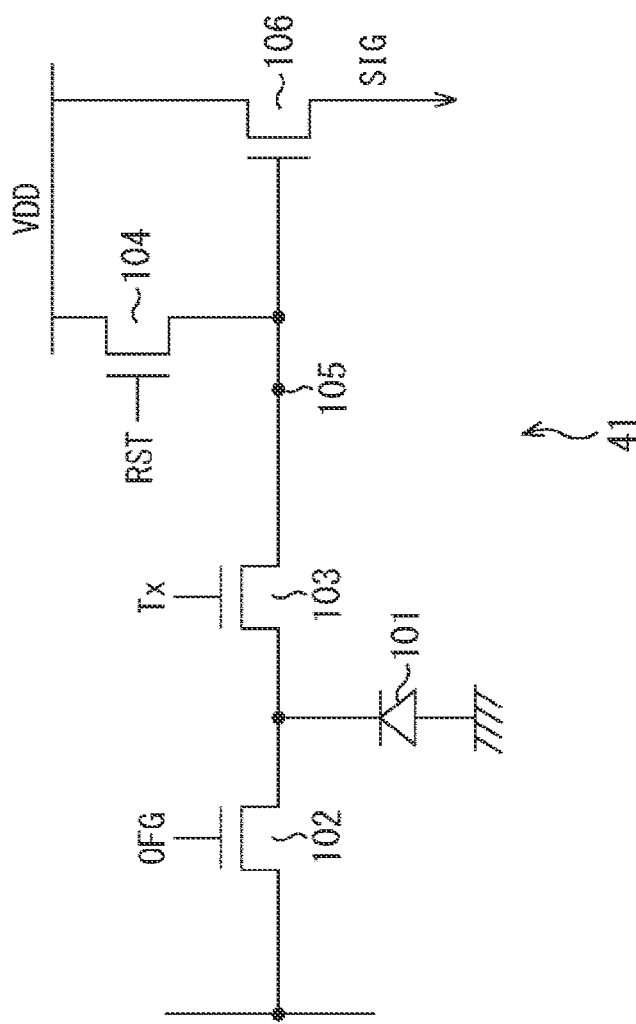
FIG. 3 is a circuit diagram of the pixel unit.

FIG. 3 is a circuit diagram of the pixel circuit 41. The pixel circuit 41 includes a photodiode (PD) 101 serving as the optical-to-electrical converter, a discharge transistor 102, a transfer transistor 103, a reset transistor 104, and a floating diffusion layer (FD) 105.

The discharge transistor 102 is used in a case where an exposure period is adjusted. Specifically, if the discharge transistor 102 is turned on when an exposure period is desired to start at an arbitrary timing, an electric charge currently accumulated in the photodiode 101 is discharged. Therefore, after the discharge transistor 102 has been turned off, the exposure period is started.

The transfer transistor 103 transfers an electric charge generated by the photodiode 101 to the FD 105. The reset transistor 104 resets an electric change held by the FD 105. The FD 105 is connected to a gate of an amplification transistor 106. A pixel signal SIG from the amplification transistor 106, that is, a pixel signal SIG from the pixel circuit 41, is supplied to the ADC 42 (FIG. 2).

The imaging apparatus 1 includes the ADC 42 for each of the pixels 21. Therefore, respective pixels 21 of the pixel array 22 of the imaging apparatus 1 can perform a global shutter operation to simultaneously reset all of the pixels and simultaneously expose all of the pixels. Exposure and reading can be simultaneously performed on all of the pixels. Therefore, there is no need for a holding unit that is normally provided in a pixel and holds an electric charge until the electric charge is read. Furthermore, in the configuration of the pixel 21, there is no need for a selection transistor or the like that is used to select a pixel that will output a pixel signal SIG and that would be needed in a column parallel reading type solid-state imaging apparatus.

<Stacked Structure>

Figure 4:
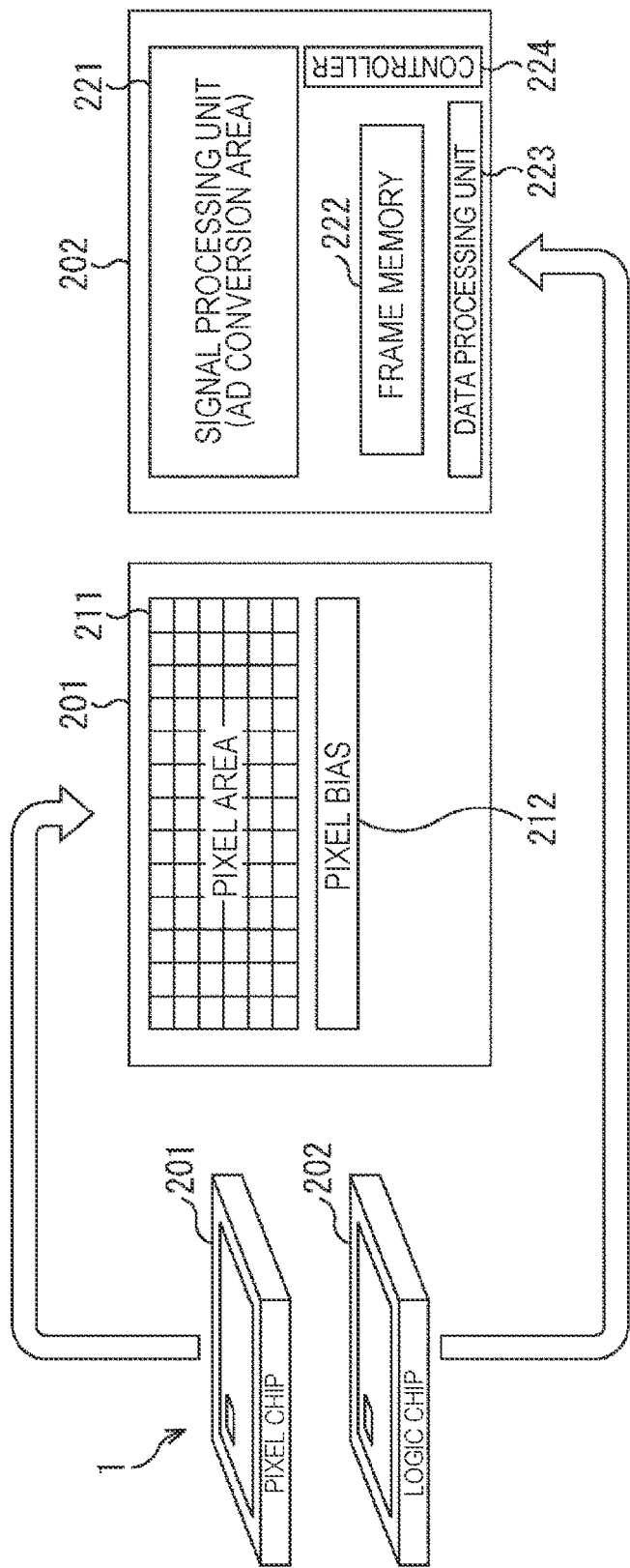
FIG. 4 is a diagram for explaining a configuration example of a stacked-type imaging apparatus.

FIG. 4 is a diagram illustrating a configuration example at a time when the imaging apparatus 1 has been formed in a two-layer structure. The imaging apparatus 1 has a structure in which a pixel chip 201 and a logic chip 202 have been stacked.

The pixel chip 201 in a first layer is provided with a pixel area 211 and a pixel bias 212. The logic chip 202 in a second layer is provided with a signal processing unit 221, a frame memory 222, a data processing unit 223, and a controller 224.

The pixel circuit 41 (FIG. 2) has been formed in a region of the pixel area 211 of the pixel chip 201 in the first layer. The ADC 42 (FIG. 2) has been formed in a region of the signal processing unit 221 of the logic chip 202 in the second layer. In the case of the structure illustrated in FIG. 4, the pixels 21 have been divided into two layers.

Figure 5:
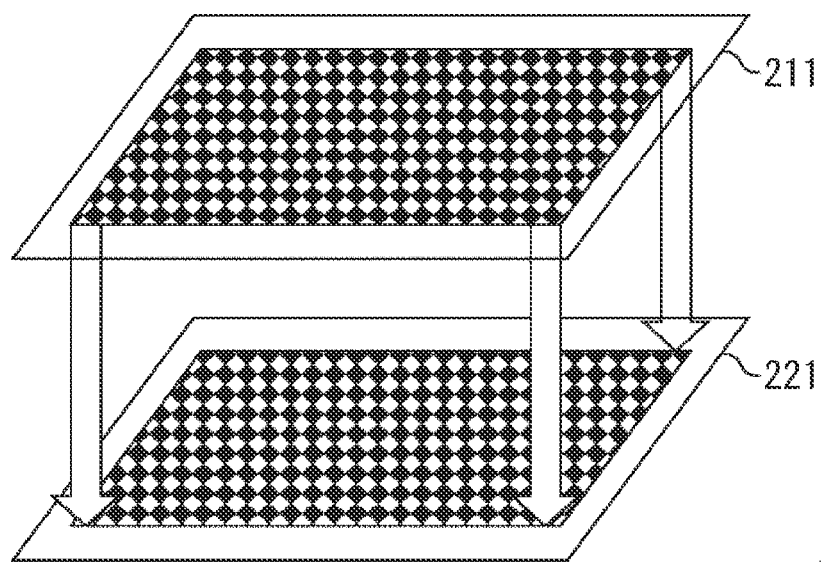
FIG. 5 is a diagram for explaining a positional relationship between a pixel and an ADC.

In the case of a configuration in which the ADC 42 is included for each of the pixels 21, the region of the pixel area 211 and the region of the signal processing unit 221 have substantially the same size, as illustrated in FIG. 5. An ADC 42 for a predetermined pixel (a pixel circuit 41) that has been formed in the pixel area 211 is located just below the predetermined pixel. The pixel circuit 41 in the pixel area 211 corresponds to the ADC 42 of the signal processing unit 221 on one-to-one basis, and therefore the region of the pixel area 211 and the region of the signal processing unit 221 have substantially the same size.

Note that description will be continued under the assumption that the pixel circuit 41 corresponds to the ADC 42 on one-to-one basis, and in other words, description will be continued under the assumption that the number of the pixel circuits 41 is the same as the number of the ADCs 42, but the present technology is also applicable to other cases. For example, the present technology is also applicable to a case where the number of the pixel circuits 41 is greater than the number of the ADCs 42. Furthermore, for example, the present technology is also applicable to a case where the ADC 42 is not provided for some pixel circuits 41 in the pixel area 211.

Referring to FIG. 4 again, the frame memory 222, the data processing unit 223, and the controller 224 are disposed in addition to the signal processing unit 221 in the logic chip 202. The signal processing unit 221 has substantially the same size as the size of the pixel area 211, as described above. The frame memory 222 is required to have enough capacity to hold data of one frame or more, as described with reference to FIG. 6. Note that the term "frame memory" has been used here, but any holding unit having a function of holding data is sufficient.

For such a reason, the logic chip 202 is larger than the pixel chip 201.

Figure 6:
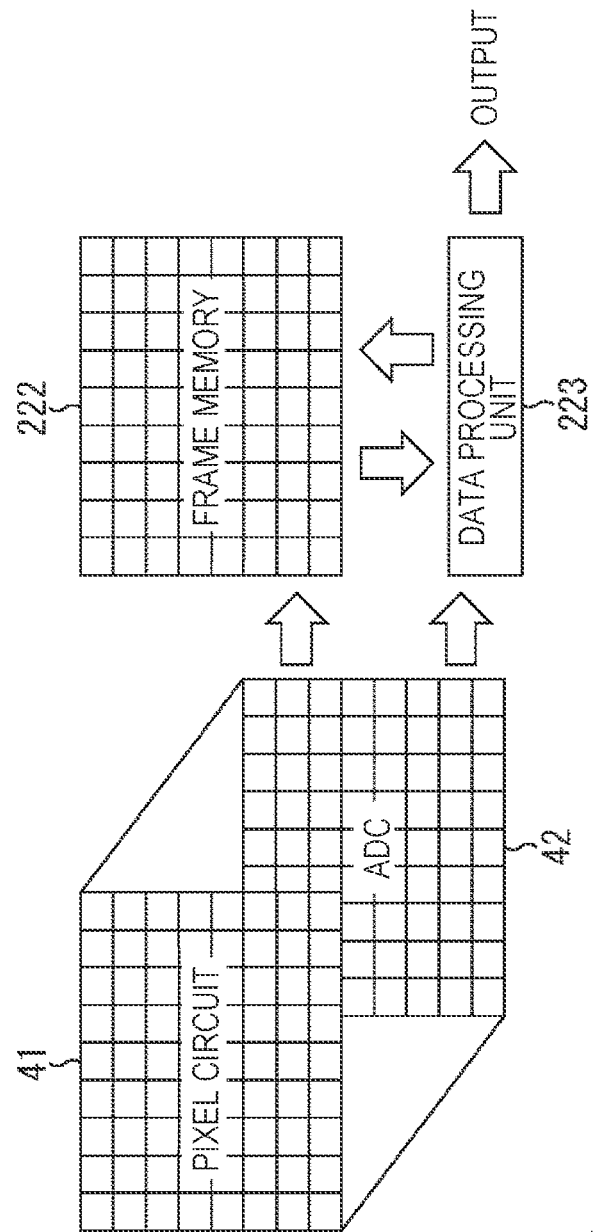
FIG. 6 is a diagram for explaining reading of a signal from a pixel.

Writing to or reading from the frame memory 222 is described with reference to FIG. 6. Thick arrows in FIG. 6 indicate a flow of a signal. In the pixel circuit 41 in the pixel area 211, a reset operation is performed by the reset transistor 104 (FIG. 3), and a transfer operation is performed by the transfer transistor 103 (FIG. 3). In the reset operation, a voltage of the floating diffusion 105 (FIG. 3) at the time of resetting performed by the reset transistor 104 is output as a reset component (a P-phase) from the pixel circuit 41 to a vertical signal line (not illustrated).

In the transfer operation, a voltage of the floating diffusion 105 at a time when an electric charge accumulated in the photodiode 101 (FIG. 3) of the pixel circuit 41 has been transferred by the transfer transistor 103 is output as a signal component (a D-phase) to the vertical signal line.

Such reading is performed, and therefore the floating diffusion 105 is reset, and AD conversion is performed on its level by the ADC 42 (a P-phase period). During the P-phase period, a value to be output from the latch storage 52 (FIG. 2) of the ADC 42 is read from one row at a time of the ADC 42, and is stored in the frame memory 222.

After the P-phase period, a photoelectron of the photodiode 101 is transferred to the floating diffusion 105, and AD conversion is performed on this level by the ADC 42 (a D-phase period). During the D-phase period, a value to be output from the latch storage 52 (FIG. 2) of the ADC 42 is read from one row at a time of the ADC 42, and is supplied to the data processing unit 223.

The data processing unit 223 subtracts the value that has been read during the D-phase period from the value that has been read during the P-phase period and has been stored in the frame memory 222, and obtains a signal. The obtained signal is written to the frame memory 222 again, and thereafter, the obtained signal is output to a rear-stage processing unit (not illustrated). Note that the signal obtained as a result of subtraction can also be output to the rear-stage processing unit without being written to the frame memory 222. Such processing that relates to obtaining a signal relating to the P-phase and the D-phase is simultaneously performed in all of the pixels.

Such processing is performed, and therefore the P-phases (reset signals) for all of the pixels need to be stored in the frame memory 222 once. Thus, as described above, the frame memory 222 is required to have enough capacity to hold data of one frame or more.

This causes the logic chip 202 to become larger than the pixel chip 201, as described above. Therefore, in consideration of stacking the pixel chip 201 and the logic chip 202, the logic chip 202 and the pixel chip 201 are made to have substantially the same size, and their sizes are determined according to the size of the logic chip 202. Thus, in a case where the imaging apparatus 1 is reduced in size, the logic chip 202 needs to be reduced in size.

Embodiments in which the logic chip 202 is reduced in size are sequentially described below.

First Embodiment

Figure 7:
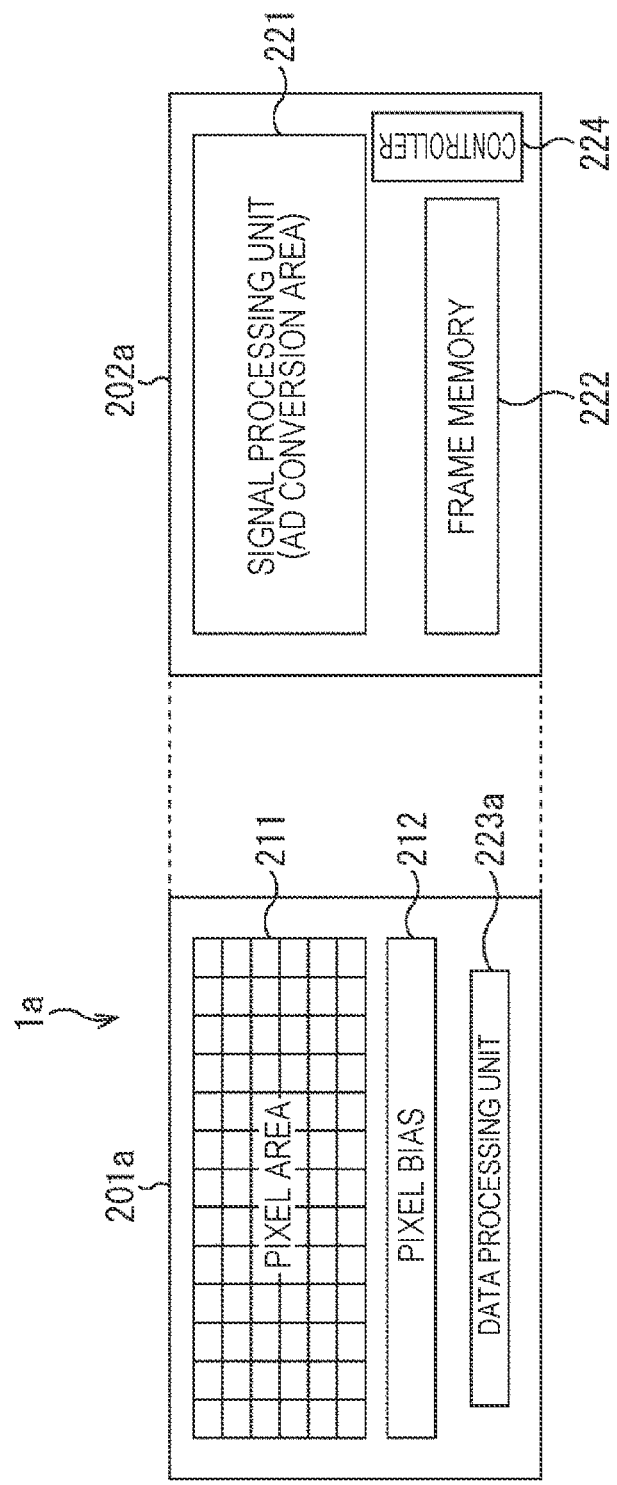
FIG. 7 is a diagram illustrating a configuration example of an imaging apparatus according to a first embodiment.

FIG. 7 is a diagram illustrating a configuration of an imaging apparatus 1 according to a first embodiment. In the description below, parts that are similar to parts in the imaging apparatus 1 illustrated in FIG. 4 or the like are denoted by the same reference signs, and duplicated description is omitted.

An imaging apparatus 1a illustrated in FIG. 7 includes two layers, a pixel chip 201a in a first layer and a logic chip 202a in a second layer, similarly to the imaging apparatus 1 illustrated in FIG. 4.

Note that description will be continued by using the terms "first layer" and "second layer", but the first layer and the second layer do not always need to be directly connected to each other. For example, the imaging apparatus 1a may be formed in a three-layer structure that includes another layer between the first layer and the second layer. In other words, the first layer is an upper layer, and the second layer is a lower layer. Therefore, a configuration in which a plurality of layers is sandwiched between the first layer and the second layer may be employed, and the present technology is also applicable to a case where a plurality of layers is included.

Furthermore, the imaging apparatus 1 may have a structure in which a chip that is different from the pixel chip 201a and the logic chip 202a has been formed in a still lower layer. The similar is applied to the description below of a second embodiment and embodiments that follow.

A pixel area 211, a pixel bias 212, and a data processing unit 223a have been formed in the pixel chip 201a. A signal processing unit 221, a frame memory 222, and a controller 224 have been formed in the logic chip 202a.

In a case where the imaging apparatus 1a illustrated in FIG. 7 is compared with the imaging apparatus 1 illustrated in FIG. 4, a difference is that the data processing unit 223 that would be formed in the logic chip 202 has been formed in the pixel chip 201a.

Referring to FIG. 4 again, the pixel area 211 and the pixel bias 212 have been formed in the pixel chip 201. Furthermore, the pixel chip 201 has been formed to have substantially the same size as the size of the logic chip 202, and therefore there remains a region even if the pixel area 211 and the pixel bias 212 are formed. The data processing unit 223 is formed in this remaining region.

Figure 8:
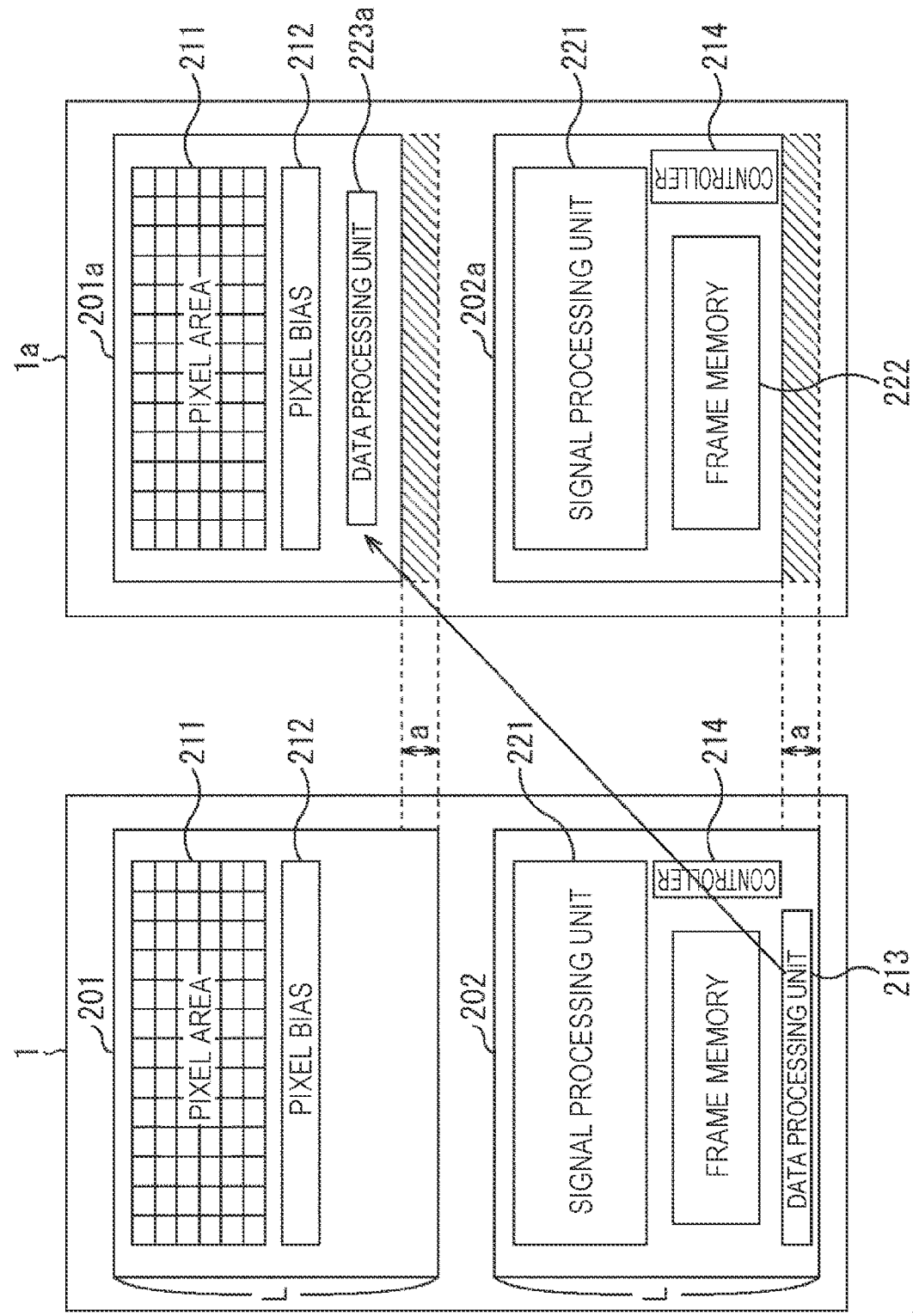
FIG. 8 is a diagram for explaining that a reduction in size is enabled.

FIG. 8 illustrates the imaging apparatus 1 illustrated in FIG. 4 and the imaging apparatus 1a illustrated in FIG. 7 side by side. In FIG. 8, a diagram on a left-hand side illustrates the imaging apparatus 1 illustrated in FIG. 4, and a diagram on a right-hand side illustrates the imaging apparatus 1a illustrated in FIG. 7.

The imaging apparatus 1a illustrated in a right-hand drawing has a configuration obtained by moving the data processing unit 223 of the logic chip 202 in the imaging apparatus 1 illustrated in a left-hand drawing to the pixel chip 201a. By moving the data processing unit 223, the imaging apparatus 1 can be reduced in size by a region of the data processing unit 223.

For example, it is assumed that a vertical length of the imaging apparatus 1 illustrated in the left-hand drawing is length L. Both lengths of the pixel chip 201 and the logic chip 202 in the imaging apparatus 1 illustrated in the left-hand drawing are length L. It is assumed that a length of the data processing unit 223 is length a.

A length of the logic chip 202a in the imaging apparatus 1a illustrated in the right-hand drawing is reduced due to removal of the data processing unit 223. Stated another way, in this case, the length of the logic chip 202a is expressed as (length L−length a), and is reduced by length a. The length of the logic chip 202 is expressed as (length L−length a), and therefore a length of the pixel chip 201a is also expressed as (length L−length a).

This enables the imaging apparatus 1a including the pixel chip 201a and the logic chip 202a to be the imaging apparatus 1a that has been reduced in size.

A flow of a signal of the imaging apparatus 1a having such a configuration is described with reference to FIG. 9. Note that an operation of the imaging apparatus 1a is similar to an operation in the case described with reference to FIG. 6.

A signal from the pixel area 211 of the pixel chip 201a in the first layer is supplied to the signal processing unit 221 (the ADC 42) of the logic chip 202a in the second layer. A signal from the signal processing unit 221 (a result of the ADC) is supplied to the frame memory 222, and is held. Data from the frame memory 222 is supplied to the data processing unit 223a of the pixel chip 201a in the first layer. A result of processing performed by the data processing unit 223a, in this case, a result of CDS, is output to a rear-stage chip, for example, a digital signal processor (DSP) chip.

Note that a signal may flow in such a way that a signal of the D-layer (a data signal) is directly supplied from the signal processing unit 221 to the data processing unit 223a.

Furthermore, a signal may flow in such a way that a CDS result is supplied from the data processing unit 223a to the frame memory 222.

Figure 9:
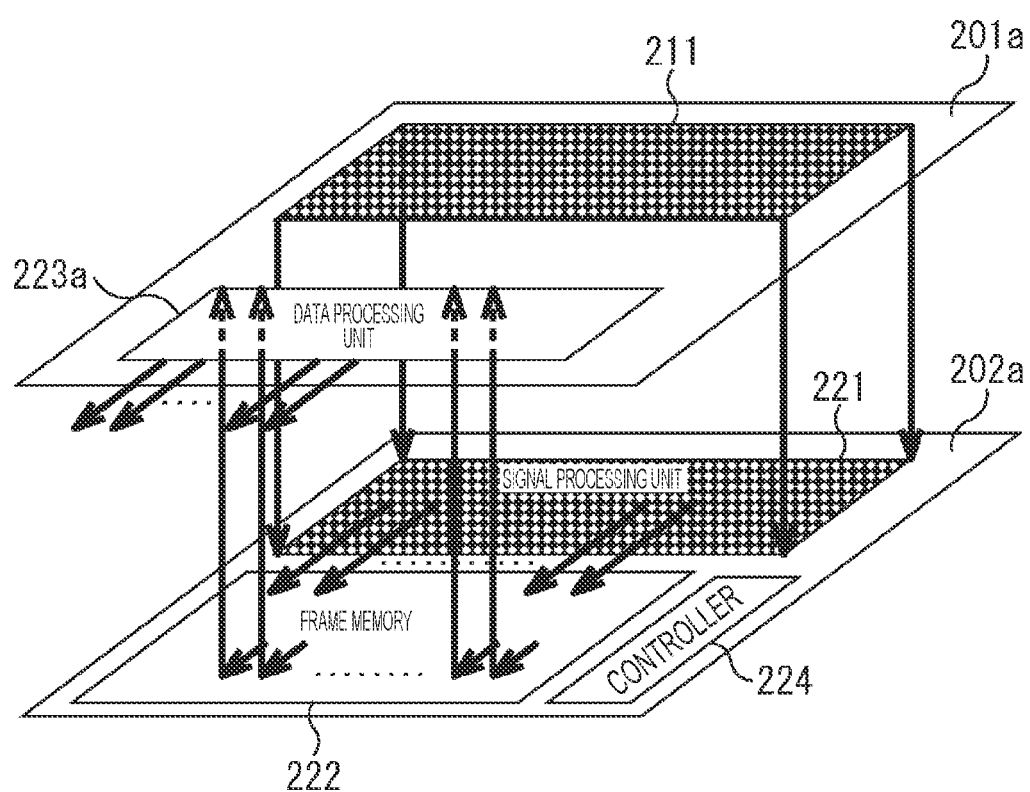
FIG. 9 is a diagram for explaining a flow of a signal.

FIGS. 7 to 9 have been described by using, as an example, a case where the data processing unit 223a is formed in the pixel chip 201a. However, a function that would be formed in the logic chip 202 and is different from the data processing unit 223 may be formed in the pixel chip 201a. For example, as illustrated in FIG. 10, the frame memory 222 may be formed in the pixel chip 201a.

Figure 10:
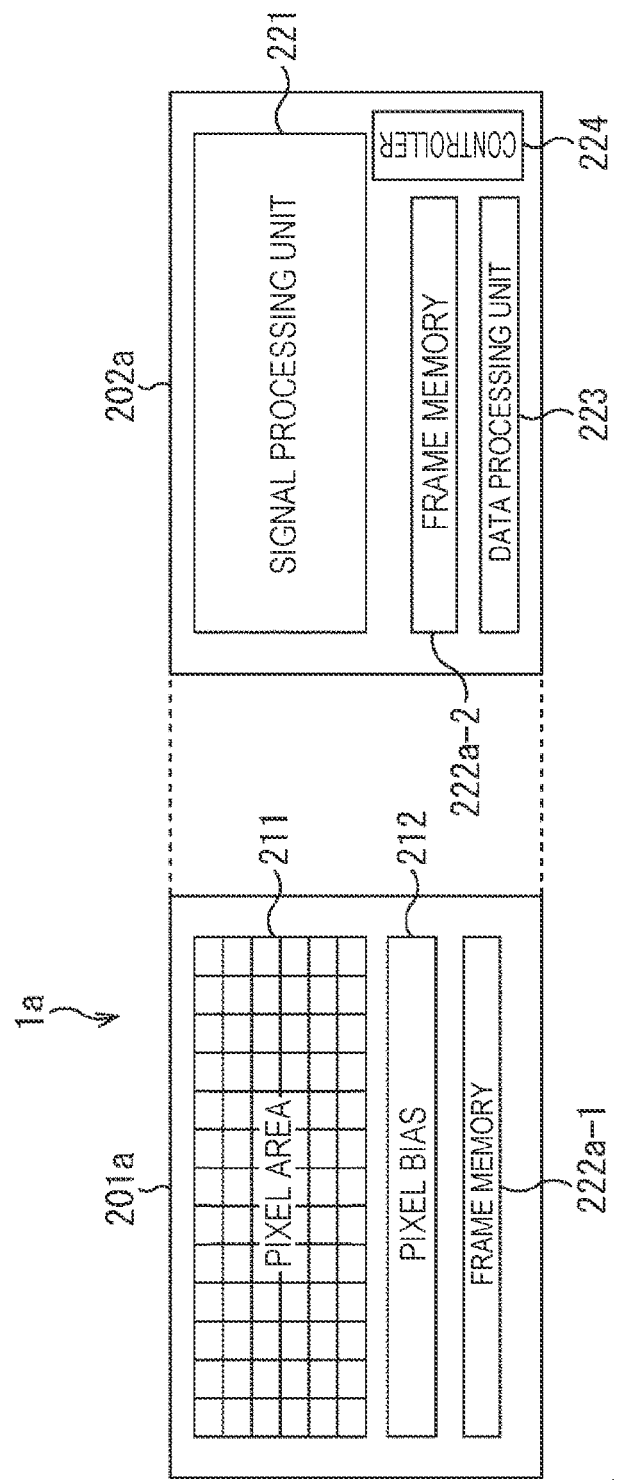
FIG. 10 is a diagram illustrating another configuration example of the imaging apparatus according to the first embodiment.

In the imaging apparatus 1a illustrated in FIG. 10, the frame memory 222 is divided into two pieces, a frame memory 222a-1 and a frame memory 222a-2, and respective frame memories are disposed in layers different from each other. Specifically, the frame memory 222a-1 is disposed in the pixel chip 201a in the first layer, and the frame memory 222a-2 is disposed in the logic chip 202a in the second layer.

By forming part of the frame memory 222 in the pixel chip 201a, as illustrated in FIG. 10, a region formed in the logic chip 202a of the frame memory 222 can be reduced, and this enables the logic chip 202a to be reduced in size. This enables a reduction in size of the imaging apparatus 1a that includes the pixel chip 201a and the logic chip 202a, and the imaging apparatus 1 that includes the ADC 42 for each of the pixels 21.

Second Embodiment

Figure 11:
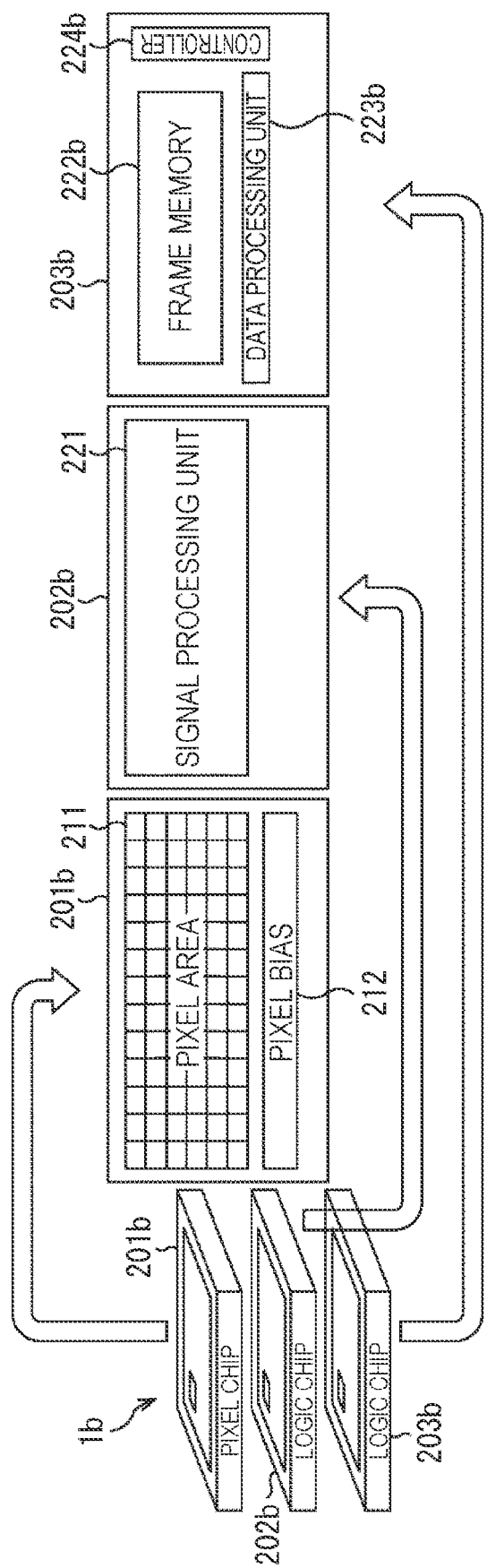
FIG. 11 is a diagram illustrating a configuration example of an imaging apparatus according to a second embodiment.

FIG. 11 is a diagram illustrating a configuration of an imaging apparatus 1 according to a second embodiment (referred to as an imaging apparatus 1b).

The imaging apparatus 1b illustrated in FIG. 11 includes three layers, a pixel chip 201b in a first layer, a logic chip 202b in a second layer, and a logic chip 203b in a third layer.

A pixel area 211 and a pixel bias 212 have been formed in the pixel chip 201b. A signal processing unit 221 has been formed in the logic chip 202b. A frame memory 222b and a controller 224b have been formed in the logic chip 203b.

Similarly in the imaging apparatus 1b, an ADC 42 has been formed for each pixel, and a region of the pixel area 211 of the pixel chip in the first layer and a region of the signal processing unit 221 (the ADC 42) in the second layer have been formed to have substantially the same size.

A three-layer structure is employed, as described above, and a frame memory 222, a data processing unit 223, and a controller 224 that have been disposed in a logic chip 202 (for example, the logic chip 202 illustrated in FIG. 4) in a second layer are moved to the logic chip 203b in the third layer. The logic chip 202b in the second layer is reduced in size by at least a region from which the frame memory 222, the data processing unit 223, and the controller 224 have been removed.

Therefore, a reduction in size of the logic chip 202b in the second layer enables the pixel chip 201b in the first layer to be reduced in size in accordance with a size of the logic chip 202b. Thus, even in the case of a configuration in which the ADC 42 is included for each of the pixels 21, the logic chip 202b can be reduced in size, the pixel chip 201b can be reduced in size, and the imaging apparatus 1b itself that includes the logic chip 202b and the pixel chip 201b can be reduced in size.

Figure 12:
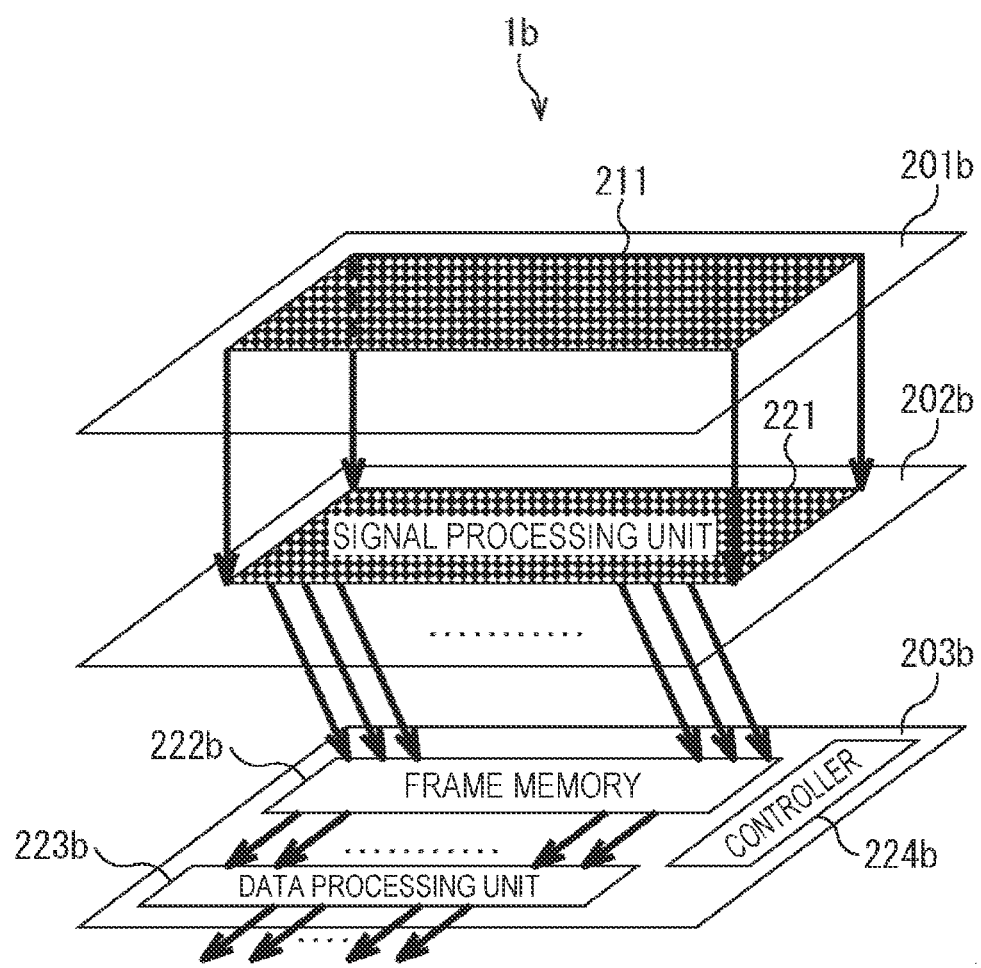
FIG. 12 is a diagram for explaining a flow of a signal.

A flow of a signal of the imaging apparatus 1b having such a configuration is described with reference to FIG. 12. Note that an operation of the imaging apparatus 1b is similar to the operation in the case described with reference to FIG. 6.

A signal from the pixel area 211 of the pixel chip 201b in the first layer is supplied to the signal processing unit 221 (the ADC 42) of the logic chip 202b in the second layer. A signal from the signal processing unit 221 (a result of the ADC) is supplied to the frame memory 222b of the logic chip 203b in the third layer, and is held.

Data from the frame memory 222b is supplied to the data processing unit 223b that has been formed in the same layer. A result of processing performed by the data processing unit 223b, in this case, a result of CDS, is output to a rear-stage chip, for example, a DSP chip.

In the imaging apparatus 1b according to the second embodiment, a path of a signal from an upper layer to a lower layer in the order of the pixel area 211, the signal processing unit 221, and the frame memory 222b is formed, and therefore wiring from the upper layer to the lower layer can be easily designed.

Similarly in the imaging apparatus 1b according to the second embodiment, the imaging apparatus 1b that includes the pixel chip 201b, the logic chip 202b, and the logic chip 203b, and includes the ADC 42 for each of the pixels 21 can be reduced in size.

Furthermore, disposition of the frame memory 222b in the logic chip 203b avoids hindering a reduction in size of the imaging apparatus 1b, even if the capacity of the frame memory 222b is increased to, for example, a capacity of one frame or more.

Third Embodiment

Figure 13:
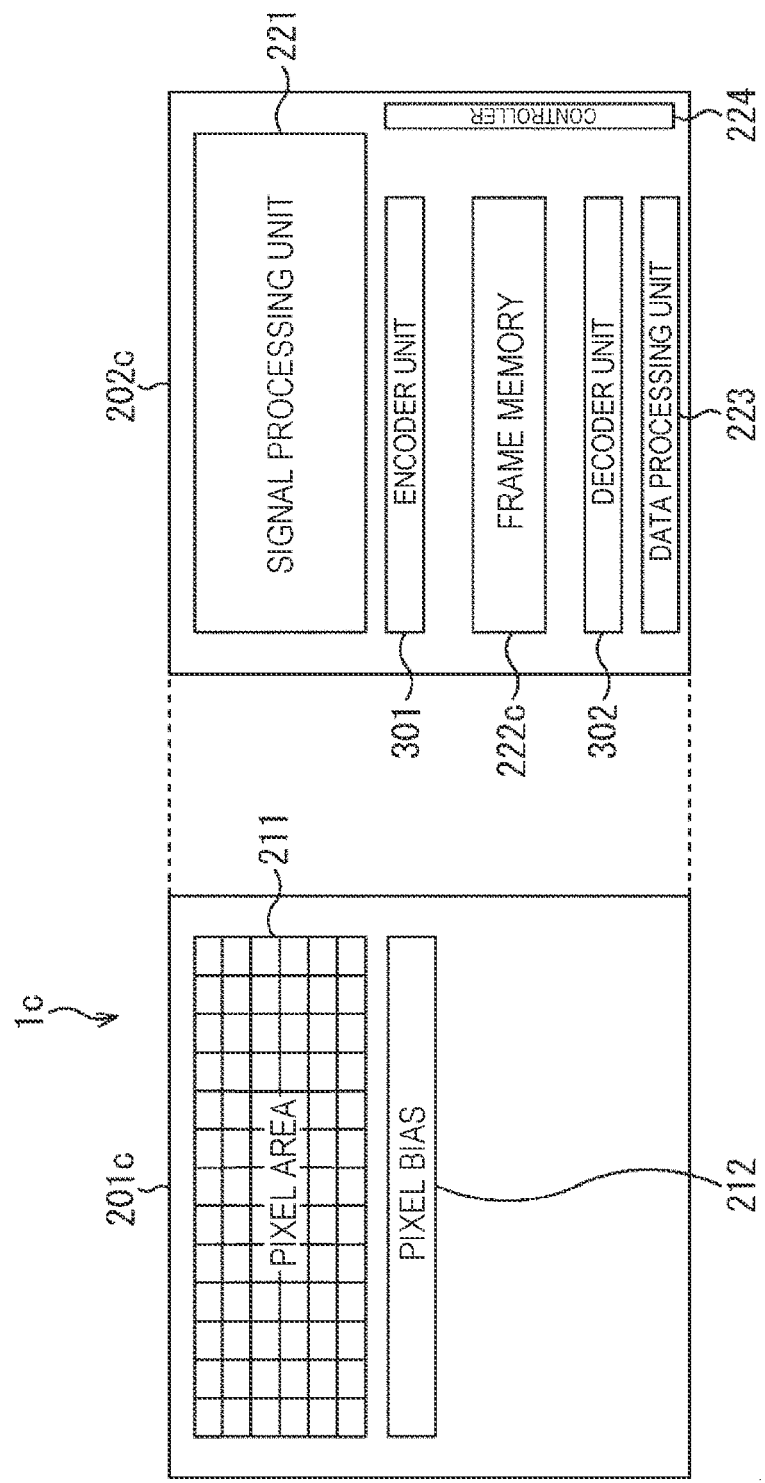
FIG. 13 is a diagram illustrating a configuration example of an imaging apparatus according to a third embodiment.

FIG. 13 is a diagram illustrating a configuration of an imaging apparatus 1 according to a third embodiment.

An imaging apparatus 1c illustrated in FIG. 13 is the same as the imaging apparatus 1 illustrated in FIG. 4 in that two layers, a pixel chip 201c in a first layer and a logic chip 202c in a second layer, are included; however, the imaging apparatus 1c illustrated in FIG. 13 is different from the imaging apparatus 1 illustrated in FIG. 4 in that a capacity of a frame memory 222c is reduced. Furthermore, there is also a difference in which an encoder unit 301 and a decoder unit 302 have been added, in order to reduce the capacity of the frame memory 222c.

The encoder unit 301 functions as an encoder that compresses a processing result of the signal processing unit 221 (a result of an ADC) according to a predetermined algorithm and supplies the processing result to the frame memory 222c. The decoder unit 302 functions as a decoder that decompresses data stored in the frame memory 222c in accordance with a decoding mode that corresponds to the encoder unit 301.

As described above, by employing a configuration including the encoder unit 301, an amount of data to be held by the frame memory 222c can be reduced, and the imaging apparatus 1c can be reduced in size.

Figure 14:
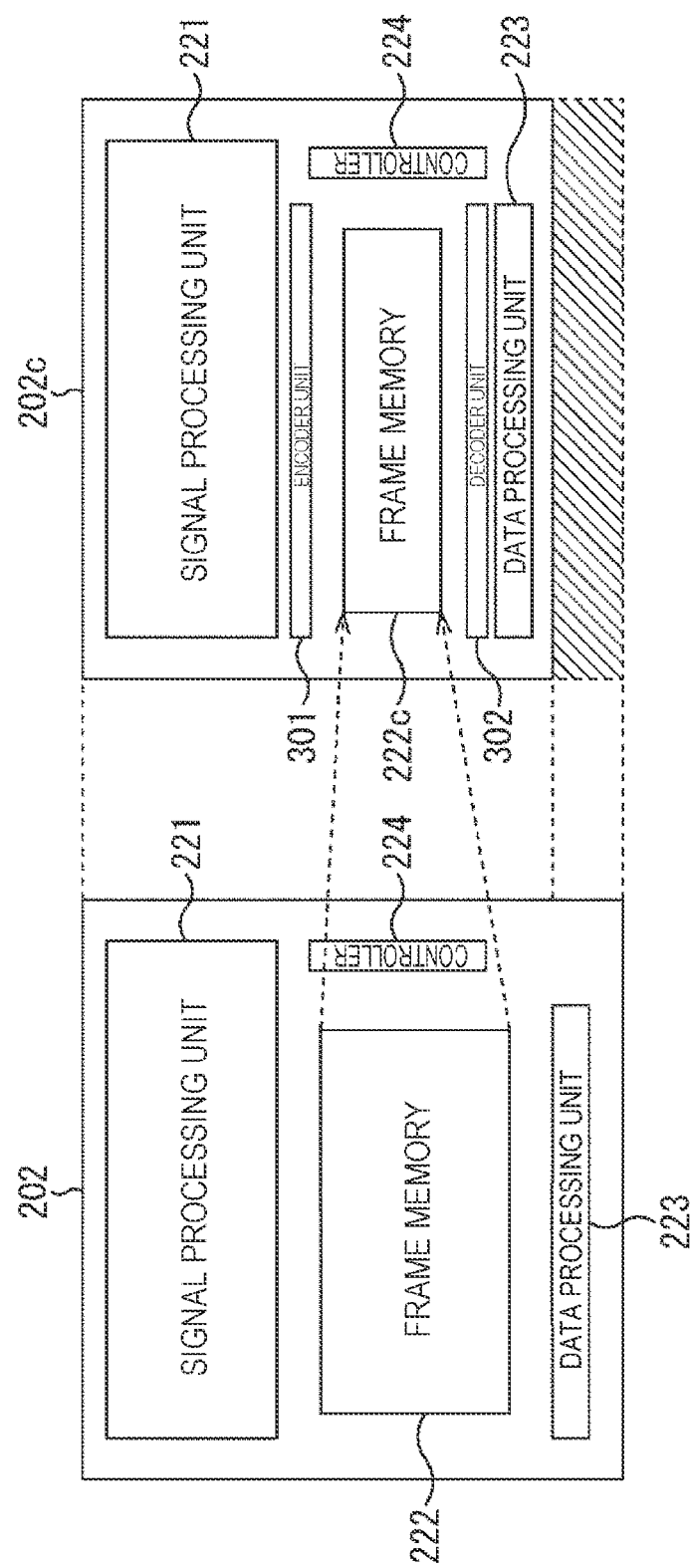
FIG. 14 is a diagram for explaining that a reduction in size is enabled.

It will be described that the imaging apparatus 1c can be reduced in size, with reference to FIG. 14. A left-hand drawing of FIG. 14 illustrates a logic chip 202 that does not include the encoder unit 301 (for example, the logic chip 202 illustrated in FIG. 4), and a right-hand drawing illustrates the logic chip 202c of the imaging apparatus 1c illustrated in FIG. 13.

The encoder unit 301 compresses data from the signal processing unit 221, and this enables a reduction in an amount of data that is required to be held by the frame memory 222c. Therefore, an area where the frame memory 222c is formed can be reduced.

This enables the logic chip 202c to be reduced in size. Furthermore, a reduction in size of the logic chip 202c enables a reduction in size of the pixel chip 201c. As a result, the imaging apparatus 1 that includes the pixel chip 201c and the logic chip 202c can be reduced in size.

Encoding performed by the encoder unit 301 may be irreversible compression or reversible compression. In general, in irreversible compression, an amount of data can be reduced more than in reversible compression. Therefore, in a case where the capacity of the frame memory 222c is desired to be reduced, an encoder unit 301 that performs encoding by performing irreversible compression can be included.

On the other hand, in irreversible compression, there is a possibility of superimposition of noise and a deterioration in image quality. Therefore, in a case where priority is given to image quality, an encoder unit 301 that performs encoding by performing reversible compression can be included. An algorithm of the encoder unit 301 is appropriately set in consideration of the capacity (a disposition area) of the frame memory 222c, desired image quality, or the like.

Figure 15:
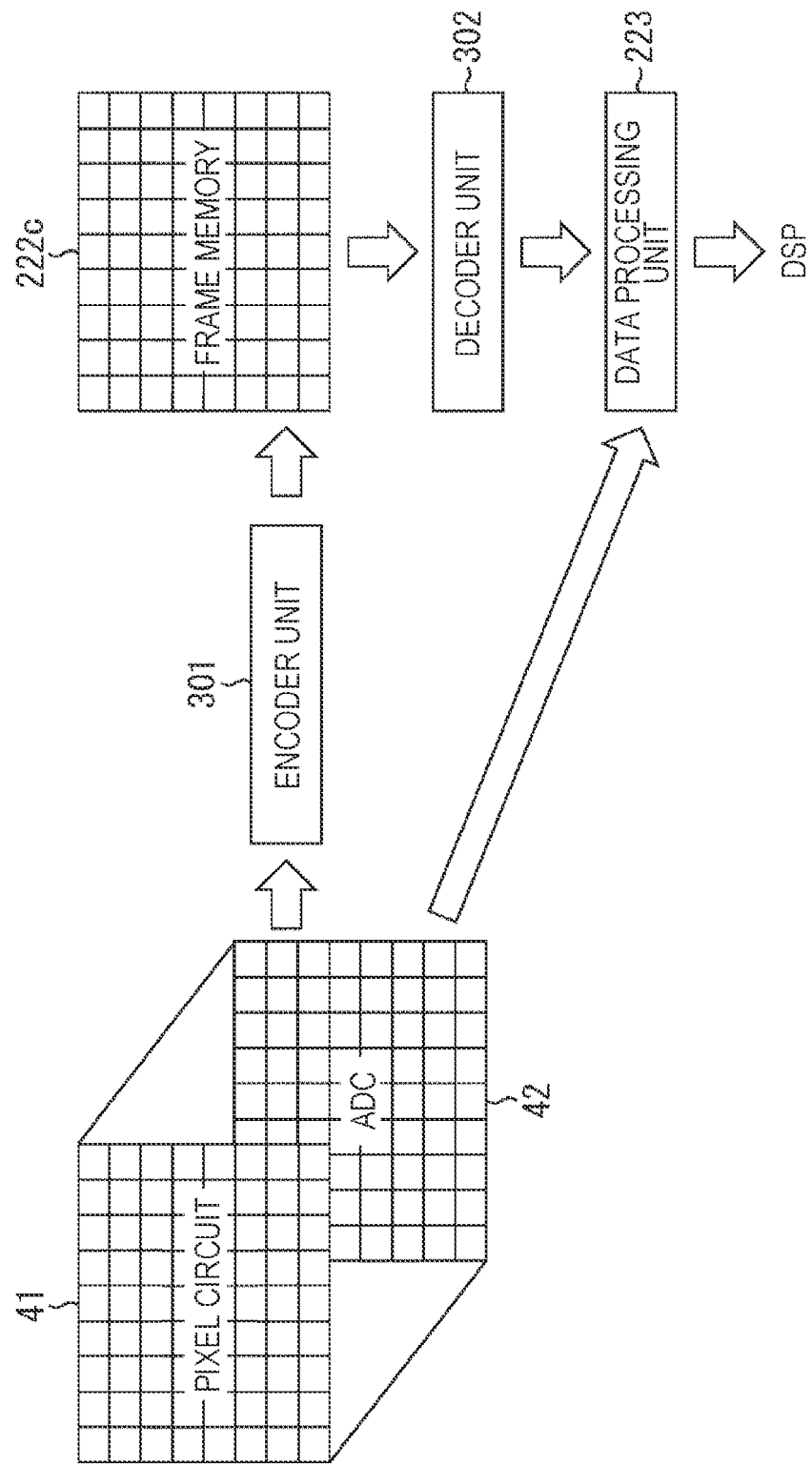
FIG. 15 is a diagram for explaining reading of a signal from a pixel.

Data held by the frame memory 222c has been compressed. Therefore, when CDS processing is performed, data that has been decompressed by the decoder unit 302 is used. Here, writing to or reading from the frame memory 222 is described with reference to FIG. 15. Thick arrows in FIG. 15 indicate a flow of a signal.

The floating diffusion 105 that configures the pixel circuit 41 is reset, and AD conversion is performed on its level by the ADC 42 (a P-phase period). During the P-phase period, a value to be output from the latch storage 52 (FIG. 2) of the ADC 42 is read from one row at a time of the ADC 42, is encoded by the encoder unit 301, and is stored in the frame memory 222c.

After the P-phase period, a photoelectron of the photodiode 101 is transferred to the floating diffusion 105, and AD conversion is performed on this level by the ADC 42 (a D-phase period). During the D-phase period, a value to be output from the latch storage 52 (FIG. 2) of the ADC 42 is read from one row at a time of the ADC 42, and is supplied to the data processing unit 223.

The data processing unit 223 performs CDS processing for subtracting the value that has been read during the D-phase period from the value that has been read during the P-phase period and has been stored in the frame memory 222c. At this time, data read from the frame memory 222c is supplied to the decoder unit 302, is decoded, and is supplied to the data processing unit 223.

A result obtained in processing performed by the data processing unit 223 is output to a rear-stage DSP.

Figure 16:
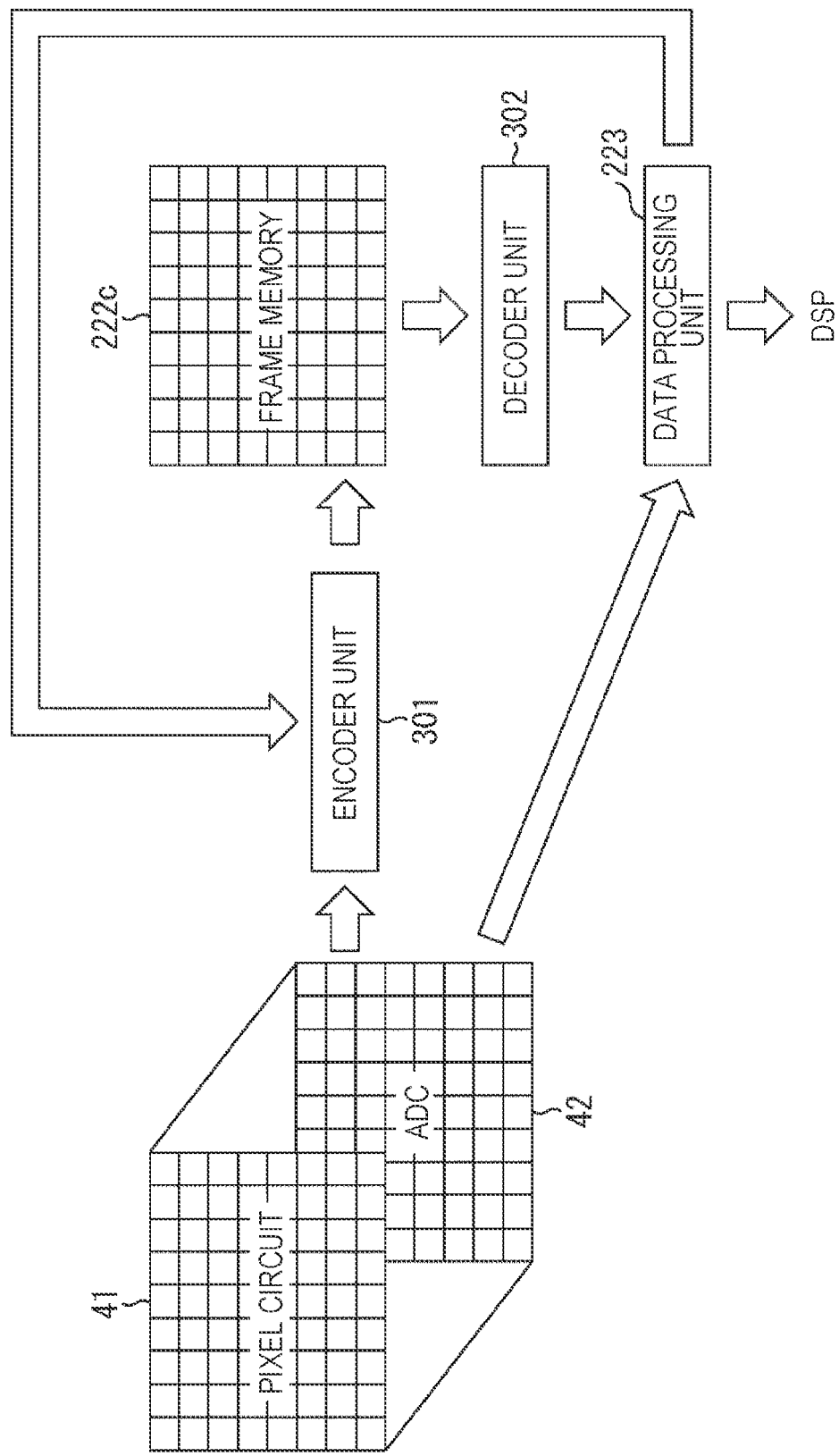
FIG. 16 is a diagram for explaining reading of a signal from a pixel.

Alternatively, as illustrated in FIG. 16, a CDS processing result from the data processing unit 223 is supplied to the encoder unit 301, is encoded, and is transitorily stored in the frame memory 222c. The CDS processing result stored in the frame memory 222 is read from the frame memory 222c at the timing of transfer to a rear-stage DSP, and is supplied to the decoder unit 302.

The CDS processing result decompressed by the decoder unit 302 is output to the rear-stage DSP (not illustrated) by the data processing unit 223.

Figure 17:
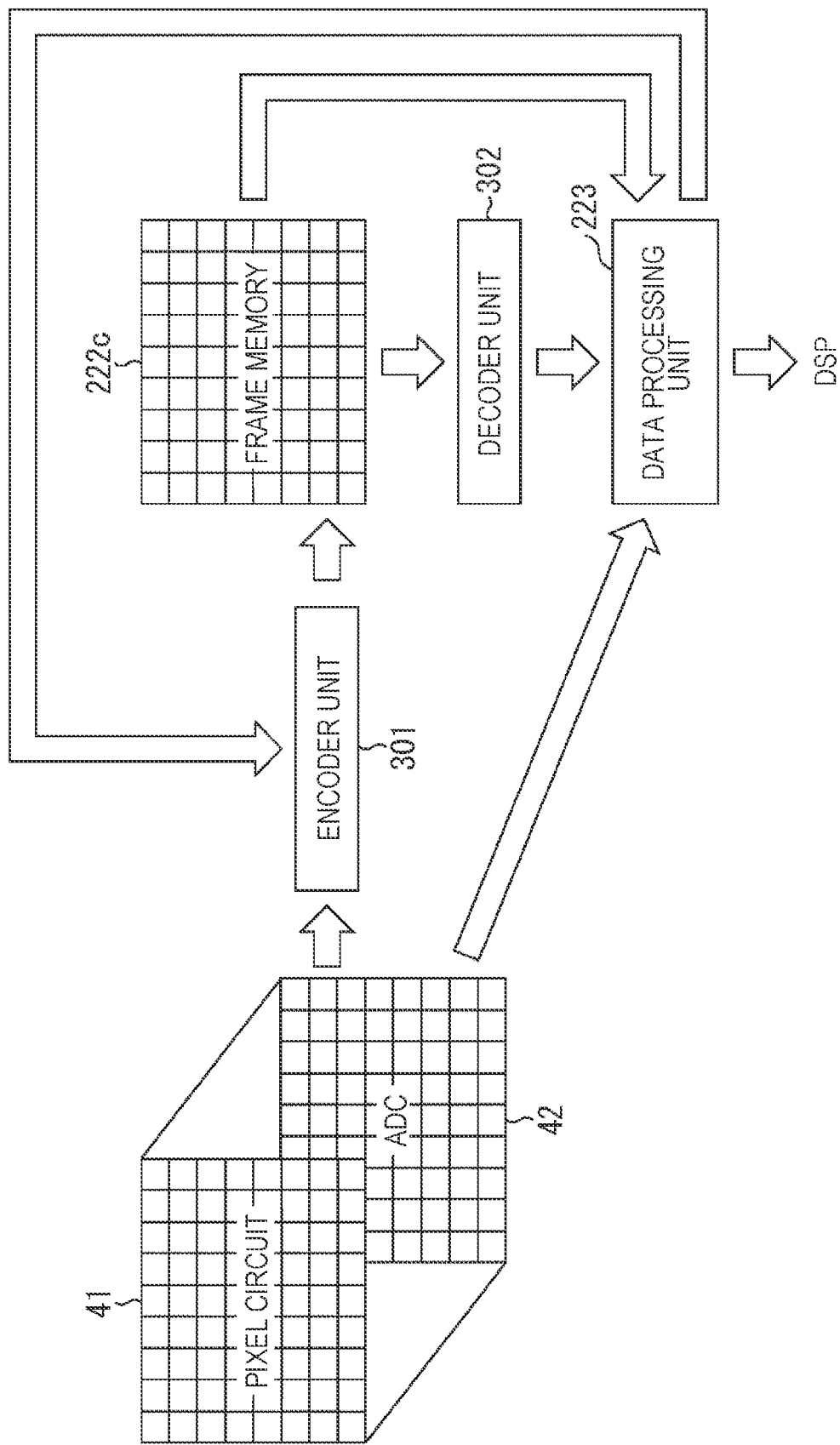
FIG. 17 is a diagram for explaining reading of a signal from a pixel.

Alternatively, as illustrated in FIG. 17, a CDS processing result from the data processing unit 223 is supplied to the encoder unit 301, is encoded, and is transitorily stored in the frame memory 222c. The CDS processing result stored in the frame memory 222 is read from the frame memory 222c at the timing of transfer to a rear-stage DSP, and is output to the rear-stage DSP (not illustrated) by the data processing unit 223.

Figure 18:
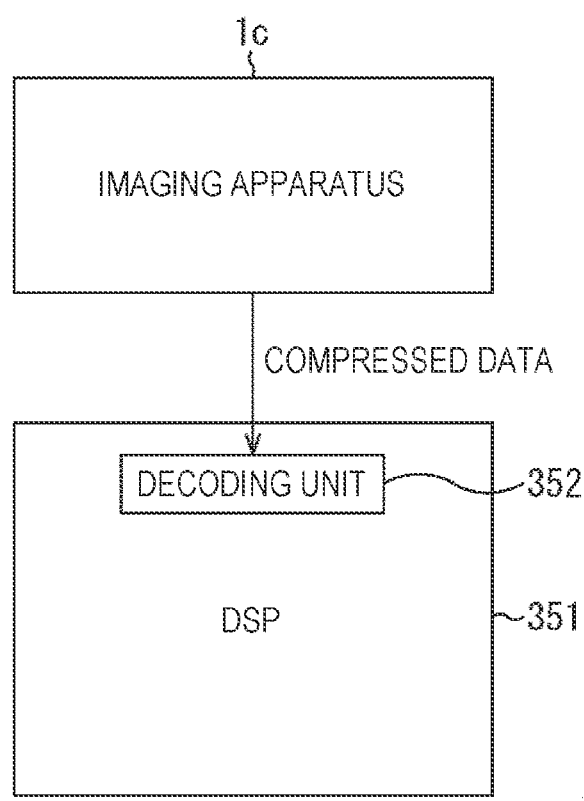
FIG. 18 is a diagram illustrating another configuration example of the imaging apparatus according to the third embodiment.

In the processing flow illustrated in FIG. 17, a compressed CDS processing result is output from the data processing unit 223 to the rear-stage DSP. As illustrated in FIG. 18, a side of a DSP 351 includes a decoding unit 352 that decompresses the compressed CDS processing result.

As illustrated in FIG. 18, the DSP 351 that processes data from the imaging apparatus 1c that performs the processing illustrated in FIG. 17 includes the decoding unit 352. The decoding unit 352 of the DSP 351 decompresses a supplied CDS processing result in accordance with the same algorithm as an algorithm of the decoder unit 302 of the imaging apparatus 1c.

Data output from the imaging apparatus 1c is compressed data. Therefore, even when uncompressed data is received as in the processing illustrated, for example, in FIG. 15 or FIG. 16, an amount of data to be received can be reduced. Thus, the time required to transfer data from the imaging apparatus 1c to the DSP 351 can be reduced. Stated another way, data can be transferred from the imaging apparatus 1c to the DSP 351 at higher speed.

Note that the positions illustrated in FIG. 13 where the encoder unit 301, the decoder unit 302, and the like are disposed on the logic chip 202c are exemplary, and do not indicate limitations. Disposition is performed to be suitable for performing the processing described with reference to FIGS. 15 to 17, and positions of disposition can be appropriately changed.

Furthermore, in a case where the processing described with reference to FIG. 16 is performed, each of an encoder unit 301 that encodes data from the ADC 42 and an encoder unit 301 that encodes a CDS processing result from the data processing unit 223 may be provided, and may be disposed in an appropriate position on the logic chip 202c.

Similarly in the imaging apparatus 1c according to the second embodiment, the imaging apparatus 1c that includes the pixel chip 201c and the logic chip 202c, and includes the ADC 42 for each of the pixels 21 can be reduced in size.

Fourth Embodiment

Figure 19:
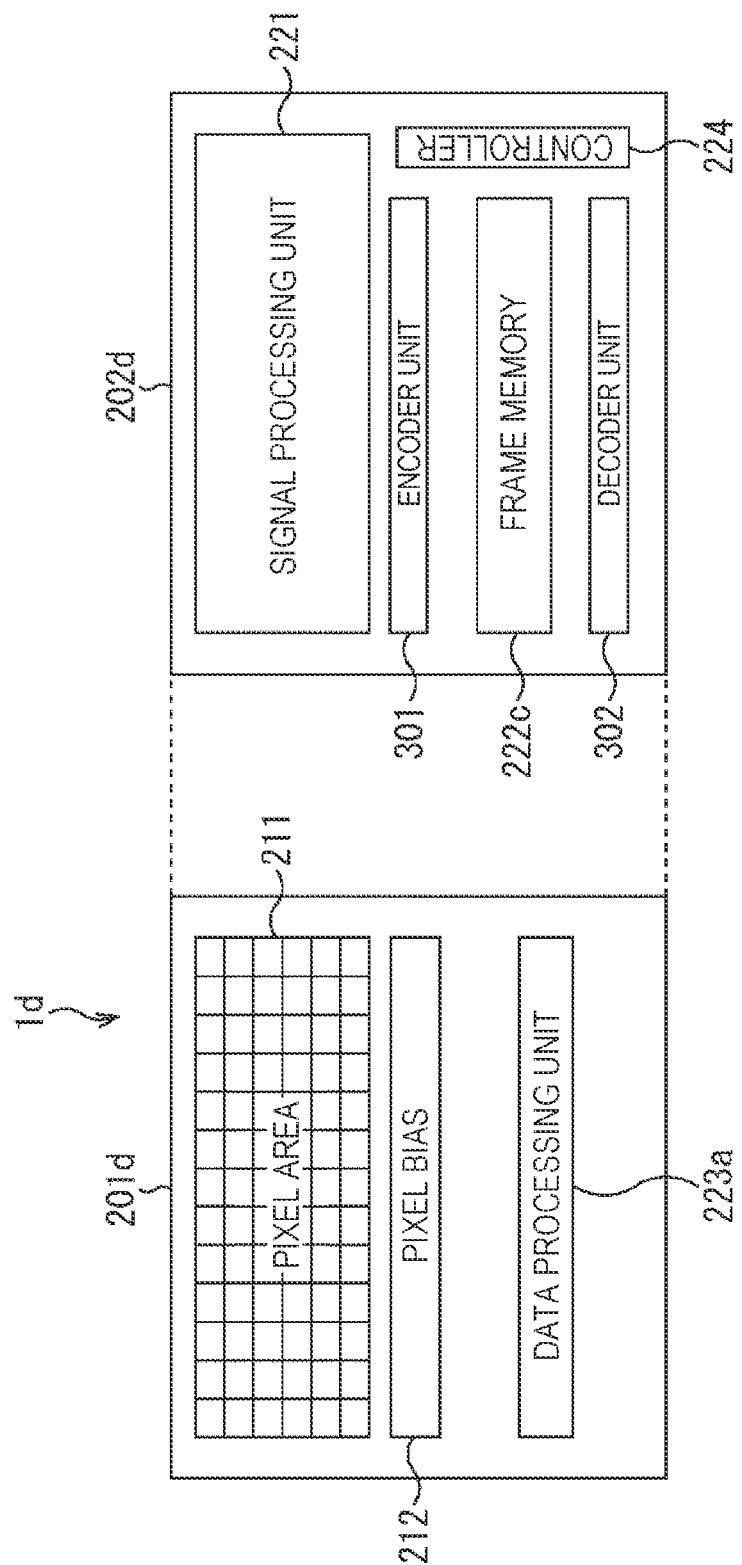
FIG. 19 is a diagram illustrating a configuration example of an imaging apparatus according to a fourth embodiment.

An imaging apparatus 1 according to a fourth embodiment is described. FIG. 19 illustrates a configuration of an imaging apparatus 1d according to the fourth embodiment.

The imaging apparatus 1 according to the fourth embodiment is an imaging apparatus obtained by combining the imaging apparatus 1a according to the first embodiment with the imaging apparatus 1c according to the third embodiment. A pixel area 211, a pixel bias 212, and a data processing unit 223a have been formed in a pixel chip 201d of the imaging apparatus 1d illustrated in FIG. 19, similarly to the imaging apparatus 1a (FIG. 7) according to the first embodiment.

A signal processing unit 221, an encoder unit 301, a frame memory 222c, a decoder unit 302, and a controller 224 have been formed in a logic chip 202d of the imaging apparatus 1d illustrated in FIG. 19, similarly to the imaging apparatus 1c (FIG. 13) according to the third embodiment.

By forming the data processing unit 223a in the pixel chip 201d, the logic chip 202d can be reduced in size by a region from which the data processing unit 223a has been removed, similarly to the imaging apparatus 1a according to the first embodiment. Furthermore, by forming the encoder unit 301, a capacity of the frame memory 222c can be reduced similarly to the imaging apparatus 1c according to the third embodiment, and the disposition area of the frame memory 222c can be reduced.

Thus, the logic chip 202d can be formed to have a smaller size, and the imaging apparatus 1d that includes the pixel chip 201d and the logic chip 202d can be further reduced in size.

Figure 20:
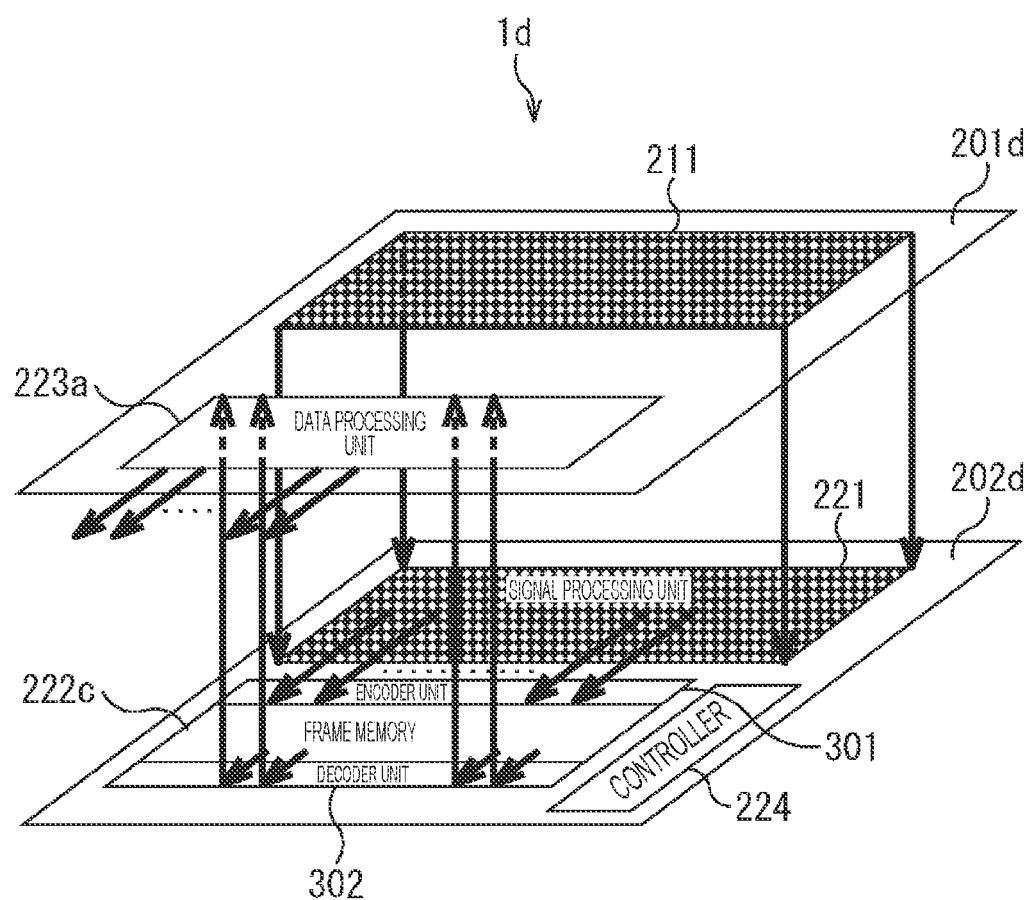
FIG. 20 is a diagram for explaining a flow of a signal.

A flow of a signal of the imaging apparatus 1d having such a configuration is described with reference to FIG. 20. Note that an operation of the imaging apparatus 1d is similar to an operation of the imaging apparatus 1c.

A signal from the pixel area 211 of the pixel chip 201d in a first layer is supplied to the signal processing unit 221 (the ADC 42) of the logic chip 202d in a second layer. A signal from the signal processing unit 221 (a result of the ADC) is supplied to the encoder unit 301 in the same layer, is encoded, is supplied to the frame memory 222c in the same layer, and is held.

Data from the frame memory 222c is supplied to the decoder unit 302 that has been formed in the same layer, is decoded, and is supplied to the data processing unit 223a in an upper layer. A result of processing performed by the data processing unit 223a, in this case, a result of CDS, is output to a rear-stage chip, for example, a DSP chip.

Similarly in the imaging apparatus 1d according to the fourth embodiment, the imaging apparatus 1d that includes the pixel chip 201d and the logic chip 202d, and includes the ADC 42 for each of the pixels 21 can be reduced in size.

Fifth Embodiment

Figure 21:
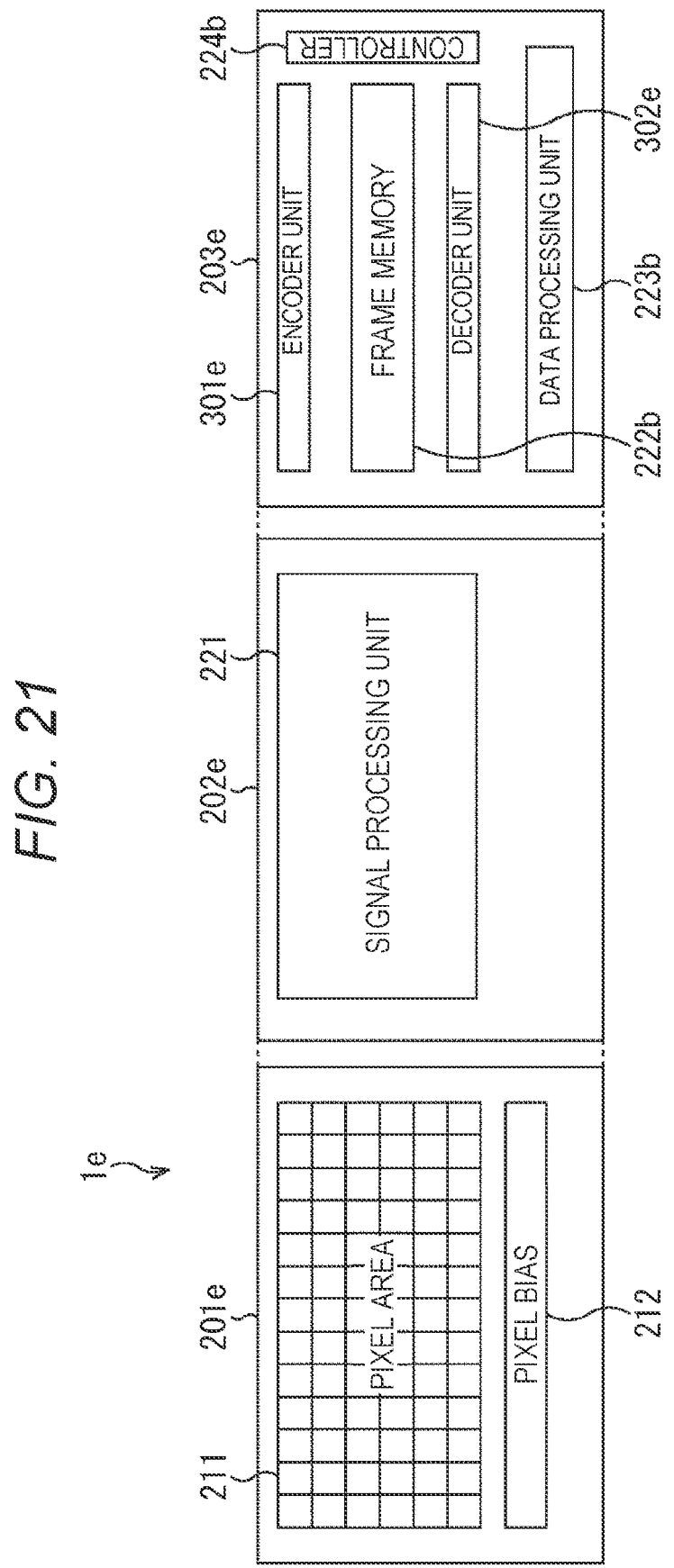
FIG. 21 is a diagram illustrating a configuration example of an imaging apparatus according to a fifth embodiment.

An imaging apparatus 1 according to a fifth embodiment is described. FIG. 21 illustrates a configuration of an imaging apparatus 1e according to the fifth embodiment.

The imaging apparatus 1 according to the fifth embodiment is an imaging apparatus obtained by combining the imaging apparatus 1b according to the second embodiment with the imaging apparatus 1c according to the third embodiment. A pixel area 211 and a pixel bias 212 have been formed in a pixel chip 201e of the imaging apparatus 1e illustrated in FIG. 21, similarly to the imaging apparatus 1b (FIG. 11) according to the second embodiment.

A signal processing unit 221 has been formed in a logic chip 202e of the imaging apparatus 1e illustrated in FIG. 21, similarly to the imaging apparatus 1b (FIG. 11) according to the second embodiment. An encoder unit 301e, a frame memory 222b, a decoder unit 302e, a data processing unit 223b, and a controller 224b have been formed in a logic chip 203e of the imaging apparatus 1e illustrated in FIG. 21.

The imaging apparatus 1e is formed to have a three-layer structure, and the encoder unit 301, the frame memory 222c, the decoder unit 302, the data processing unit 223, and the controller 224 that have been disposed in the logic chip 202c (FIG. 13) in the second layer are moved to the logic chip 203e in the third layer. This enables the logic chip 202d in the second layer to be reduced in size.

Therefore, a reduction in size of the logic chip 202d in the second layer enables the pixel chip 201e in the first layer to be reduced in size in accordance with the logic chip 202b. Thus, even in the case of a configuration in which the ADC 42 is included for each of the pixels 21, the logic chip 202e can be reduced in size, the pixel chip 201e can be reduced in size, and the imaging apparatus 1e itself that includes the logic chip 202e and the pixel chip 201e can be reduced in size.

Figure 22:
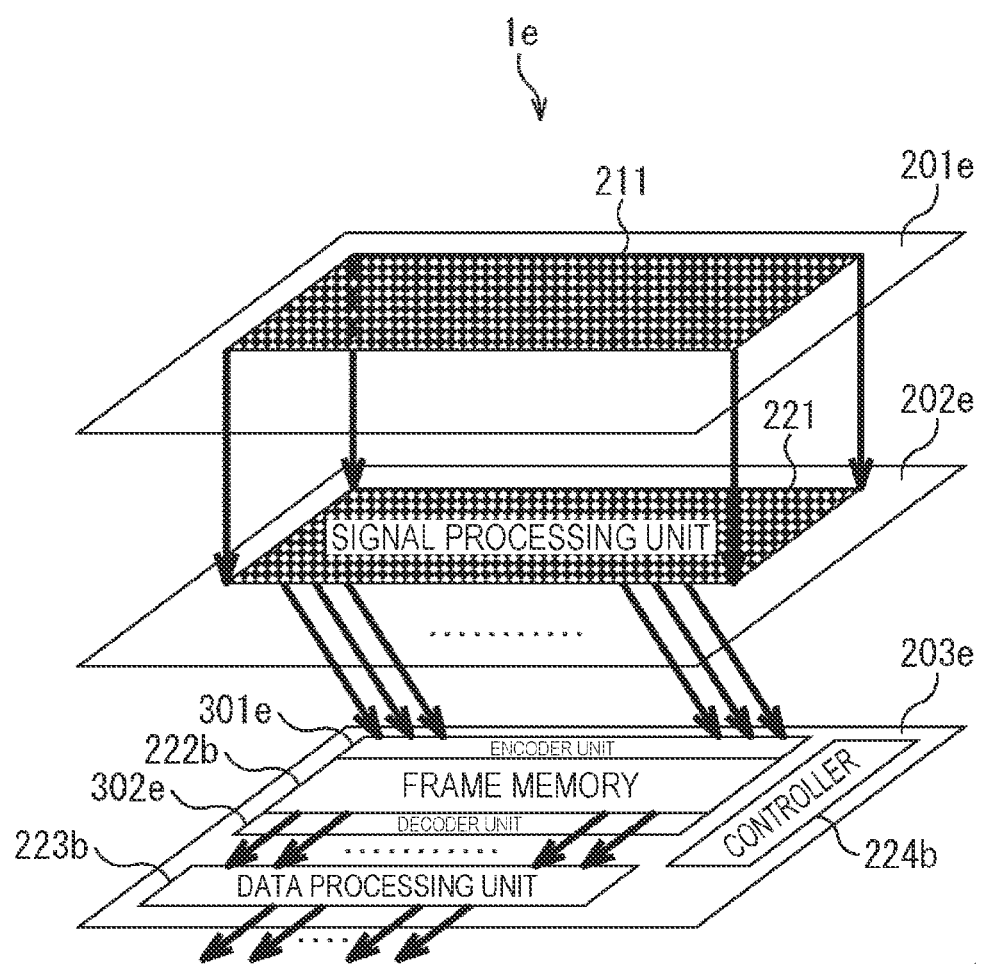
FIG. 22 is a diagram for explaining a flow of a signal.

A flow of a signal of the imaging apparatus 1e having such a configuration is described with reference to FIG. 22. Note that an operation of the imaging apparatus 1e is similar to the operation of the imaging apparatus 1c.

A signal from the pixel area 211 of the pixel chip 201e in the first layer is supplied to the signal processing unit 221 (the ADC 42) of the logic chip 202e in the second layer. A signal from the signal processing unit 221 (a result of the ADC) is supplied to the encoder unit 301e of the logic chip 203e in the third layer, is encoded, is supplied to the frame memory 222b in the same layer, and is held.

Data from the frame memory 222b is supplied to the decoder unit 302e that has been formed in the same layer, is decoded, and is supplied to the data processing unit 223b in the same layer. A result of processing performed by the data processing unit 223b, in this case, a result of CDS, is output to a rear-stage chip, for example, a DSP chip.

The configuration illustrated in FIG. 21 of the imaging apparatus 1e is exemplary, and does not indicate limitations. For example, the imaging apparatus 1e illustrated in FIG. 21 may have a configuration in which the data processing unit 223b disposed in the logic chip 203e is disposed in the pixel chip 201e.

Furthermore, for example, the imaging apparatus 1e illustrated in FIG. 21 may have a configuration in which the data processing unit 223b disposed in the logic chip 203e is disposed in the logic chip 202e.

Furthermore, for example, the imaging apparatus 1e illustrated in FIG. 21 may have a configuration in which any one of or both the encoder unit 301e and the decoder unit 302e that are disposed in the logic chip 203e are disposed in the pixel chip 201e.

Similarly in the imaging apparatus 1e according to the fifth embodiment, the imaging apparatus 1e that includes the pixel chip 201e, the logic chip 202e, and the logic chip 203e, and includes the ADC 42 for each of the pixels 21 can be reduced in size.

The embodiments described above have been described by using, as an example, a case where the imaging apparatus 1 has a two-layer structure or a three-layer structure. However, the imaging apparatus 1 may have a structure of three layers or more, such as a four-layer structure or a five-layer structure. Furthermore, a case where a frame memory has enough capacity to hold data of two frames and two layers are included also falls within an applicable range of the present technology.

According to the present technology, an imaging apparatus that includes an ADC for each pixel can be reduced in size. A size of a chip that configures the imaging apparatus can be reduced, and this enables improvements in a theoretical yield. Furthermore, static timing analysis (STA) or the like at the time of designing of the chip can be easily performed due to a reduction in size of the chip.

<Electronic Device>

The present disclosure is not only applied to an imaging apparatus, but is also applicable to electronic devices in general that use the imaging apparatus as an image capturing unit (an optical-to-electrical converter), e.g., imaging apparatuses such as digital still cameras or video cameras, portable terminal apparatuses that have an imaging function, such as portable telephones, copying machines that use the imaging apparatus as an image reader, and the like. Note that, in some cases, the module type form described above, that is, a camera module, that is mounted on an electronic device serves as the imaging apparatus.

Figure 23:
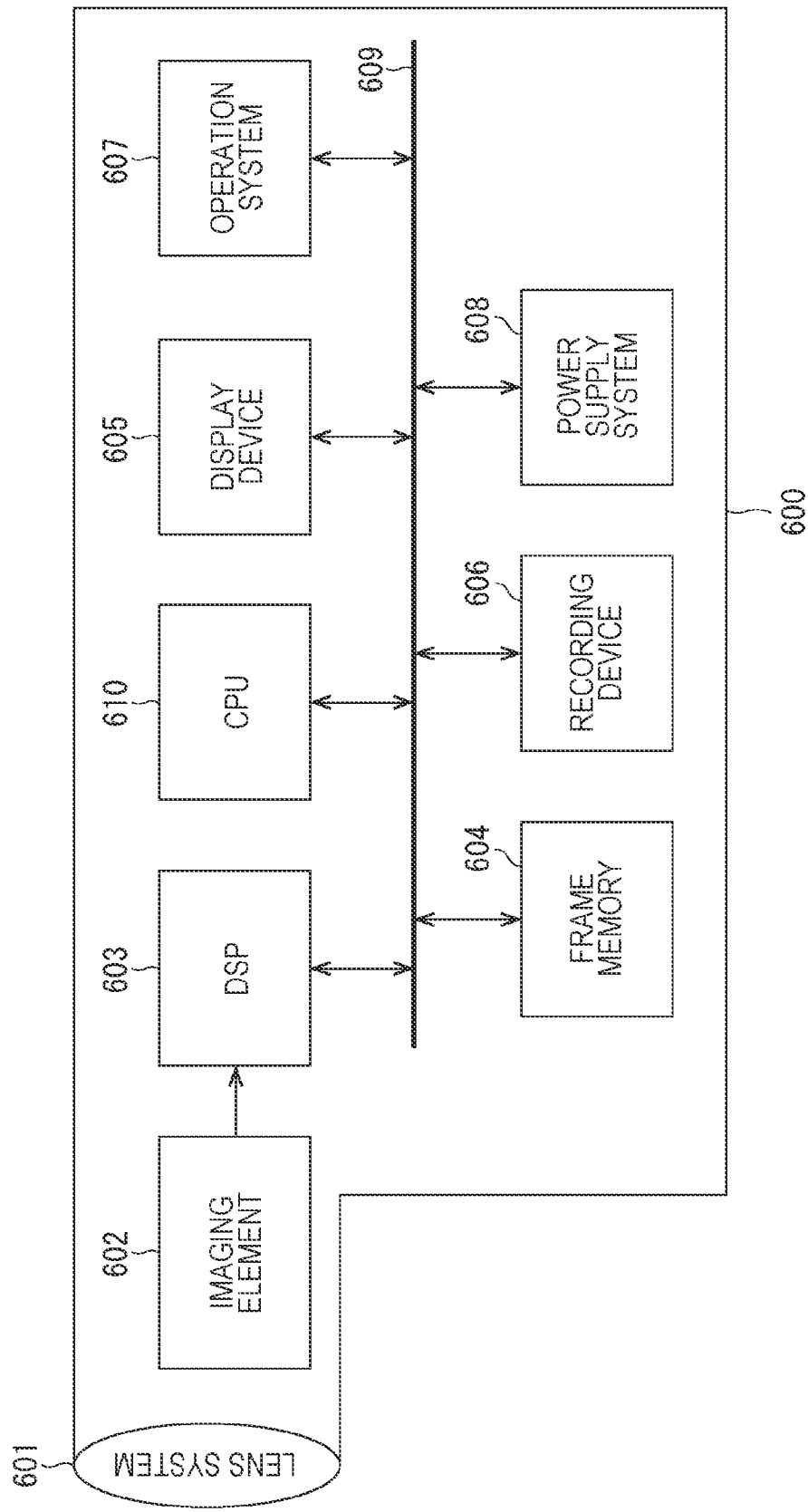
FIG. 23 is a diagram illustrating a configuration of an electronic device.

FIG. 23 is a block diagram illustrating a configuration example of an imaging apparatus that is an example of an electronic device according to the present disclosure. As illustrated in FIG. 23, an imaging apparatus 600 according to the present disclosure includes an optical system including a lens group 601 or the like, an imaging element 602, a DSP circuit 603 serving as a camera signal processing unit, a frame memory 604, a display device 605, a recording device 606, an operation system 607, a power supply system 608, and the like.

Then, a configuration is employed where the DSP circuit 603, the frame memory 604, the display device 605, the recording device 606, the operation system 607, and the power supply system 608 are connected to each other via a bus line 609. A CPU 610 controls respective units in the imaging apparatus 600.

The lens group 601 takes in incident light (image light) from a subject, and forms an image on an imaging plane of the imaging element 602. The imaging element 602 converts an amount of the incident light for which an image has been formed on the imaging plane by the lens group 601 into an electric signal for each pixel, and outputs the electric signal as a pixel signal. A solid-state imaging element according to the embodiment described above can be used as this imaging element 602.

The display device 605 includes a panel type display device such as a liquid crystal display device or an organic electro luminescence (EL) display device, and displays a moving image or a still image that has been captured by the imaging element 602. The recording device 606 records the moving image or the still image that has been captured by the imaging element 602 in a recording medium such as a video tape or a digital versatile disk (DVD).

The operation system 607 issues an operation command relating to various functions that the present imaging apparatus has, in accordance with an operation performed by a user. The power supply system 608 appropriately supplies various types of power serving as operation power of the DSP circuit 603, the frame memory 604, the display device 605, the recording device 606, and the operation system 607, to these supply targets.

Such an imaging apparatus 600 is applied to video cameras or digital still cameras, and camera modules for mobile devices such as portable telephones. Then, in this imaging apparatus 600, the imaging apparatus according to the embodiment described above can be used as the imaging element 602.

<Example of Utilization in Intracorporeal Information Acquisition System>

The technology according to the present disclosure (the present technology) can be utilized in a variety of products. For example, the technology according to the present disclosure may be applied to an endoscopic surgery system.

Figure 24:
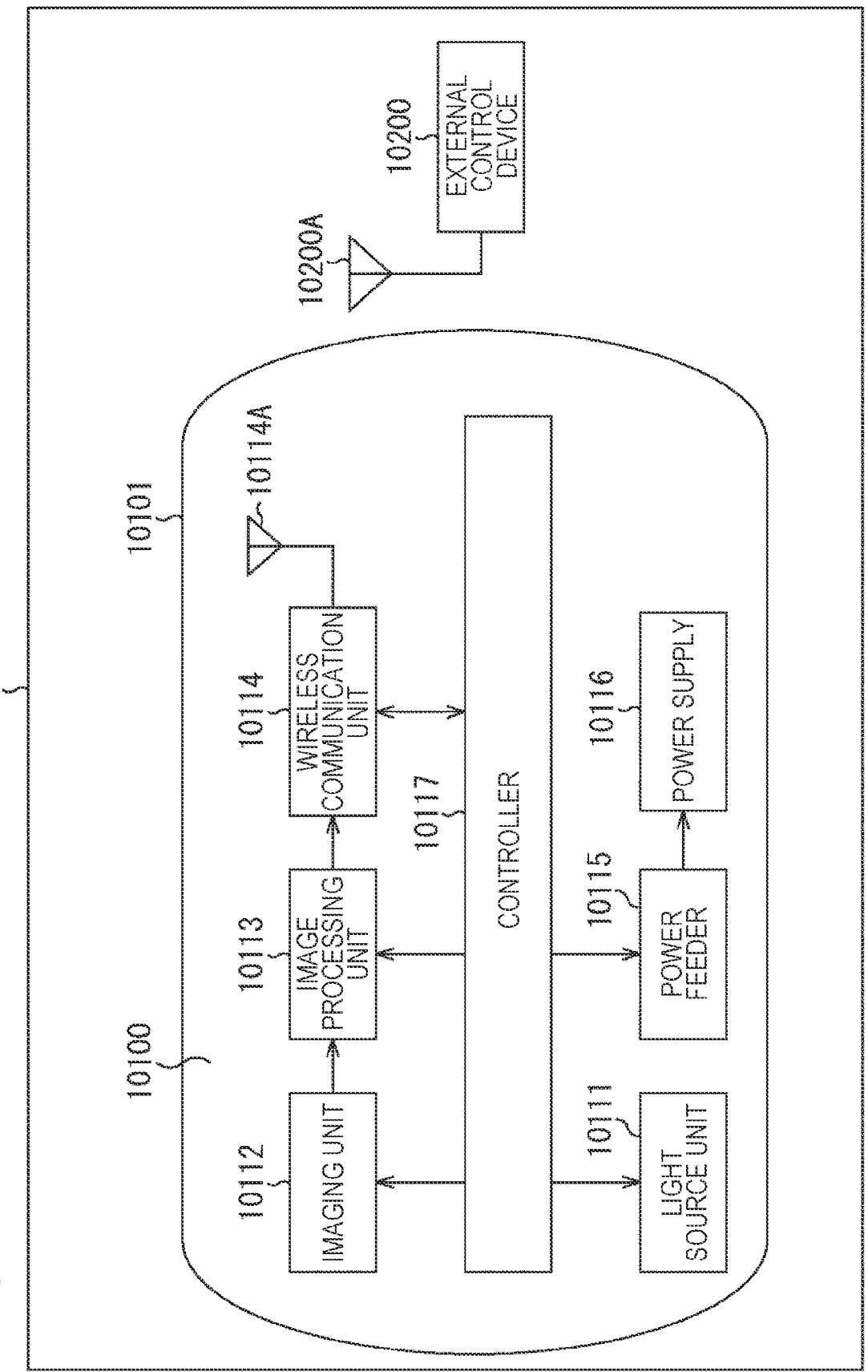
FIG. 24 is a block diagram illustrating an example of a schematic configuration of an intracorporeal information acquisition system.

FIG. 24 is a block diagram illustrating an example of a schematic configuration of a patient intracorporeal information acquisition system that uses a capsule type endoscope and to which the technology according to the present disclosure (the present technology) can be applied.

An intracorporeal information acquisition system 10001 includes a capsule type endoscope 10100 and an external control device 10200.

The capsule type endoscope 10100 is swallowed by a patient in an examination. The capsule type endoscope 10100 has an imaging function and a wireless communication function. Until the capsule type endoscope 10100 is spontaneously discharged from the patient, the capsule type endoscope 10100 sequentially captures an image inside an organ such as the stomach or the intestine (hereinafter also referred to as an intracorporeal image) at predetermined intervals while moving inside the organ due to peristaltic movement or the like, and sequentially and wirelessly transmits information relating to the intracorporeal image to the external control device 10200 outside the body.

The external control device 10200 integrally controls an operation of the intracorporeal information acquisition system 10001. Furthermore, the external control device 10200 receives the information relating to the intracorporeal image that has been transmitted from the capsule type endoscope 10100, and generates image data for displaying the intracorporeal image on a display device (not illustrated), on the basis of the received information relating to the intracorporeal image.

By doing this, the intracorporeal information acquisition system 10001 can obtain an intracorporeal image indicating a state inside the patient's body at any time after the capsule type endoscope 10100 is swallowed and before the capsule type endoscope 10100 is discharged.

Configurations and functions of the capsule type endoscope 10100 and the external control device 10200 are described in more detail.

The capsule type endoscope 10100 includes a housing 10101 of a capsule type, and a light source unit 10111, an imaging unit 10112, an image processing unit 10113, a wireless communication unit 10114, a power feeder 10115, a power supply 10116, and a controller 10117 are housed in the housing 10101.

The light source unit 10111 includes a light source such as a light emitting diode (LED), for example, and applies light to an imaging field of view of the imaging unit 10112.

The imaging unit 10112 includes an imaging element, and an optical system that includes a plurality of lenses that is provided in a front stage of the imaging element. Reflected light of light applied to body tissues serving as an observation target (hereinafter referred to as observation light) is condensed by the optical system, and enters the imaging element. In the imaging unit 10112, the imaging element performs optical-to-electrical conversion on the observation light that has entered the imaging element, and generates an image signal that corresponds to the observation light. The image signal generated by the imaging unit 10112 is provided to the image processing unit 10113.

The image processing unit 10113 includes a processor such as a central processing unit (CPU) or a graphics processing unit (GPU), and performs various types of signal processing on the image signal generated by the imaging unit 10112. The image processing unit 10113 provides the image signal on which signal processing has been performed, as raw data, to the wireless communication unit 10114.

The wireless communication unit 10114 performs predetermined processing, such as modulation processing, on the image signal on which the image processing unit 10113 has performed signal processing, and transmits the image signal to the external control device 10200 via an antenna 10114A. Furthermore, the wireless communication unit 10114 receives a control signal that relates to drive control of the capsule type endoscope 10100, from the external control device 10200 via the antenna 10114A. The wireless communication unit 10114 provides the controller 10117 with the control signal received from the external control device 10200.

The power feeder 10115 includes an antenna coil for power reception, a power regeneration circuit that regenerates power from a current generated in the antenna coil, a booster circuit, and the like. The power feeder 10115 generates power by using the principle of what is called non-contact charging.

The power supply 10116 includes a secondary battery, and stores power generated by the power feeder 10115. In FIG. 24, an arrow or the like that indicates a destination to which power is supplied from the power supply 10116 is omitted in order to avoid the complication of the drawing. However, power stored in the power supply 10116 is supplied to the light source unit 10111, the imaging unit 10112, the image processing unit 10113, the wireless communication unit 10114, and the controller 10117, and can be used to drive them.

The controller 10117 includes a processor such as a CPU, and appropriately controls the drive of the light source unit 10111, the imaging unit 10112, the image processing unit 10113, the wireless communication unit 10114, and the power feeder 10115 in accordance with the control signal transmitted from the external control device 10200.

The external control device 10200 includes a processor such as a CPU or a GPU, a microcomputer or a control substrate in which the processor and a storage element such as a memory are mixed, or the like. The external control device 10200 transmits the control signal to the controller 10117 of the capsule type endoscope 10100 via the antenna 10200A to control an operation of the capsule type endoscope 10100. In the capsule type endoscope 10100, for example, conditions of the light source unit 10111 for applying light to an observation target can be changed according to the control signal from the external control device 10200. Furthermore, imaging conditions (for example, a frame rate, an exposure value, or the like in the imaging unit 10112) can be changed according to the control signal from the external control device 10200. Furthermore, the content of processing performed by the image processing unit 10113 or conditions for the wireless communication unit 10114 transmitting an image signal (for example, a transmission interval, the number of images to be transmitted, or the like) may be changed according to the control signal from the external control device 10200.

Furthermore, the external control device 10200 performs various types of image processing on an image signal transmitted from the capsule type endoscope 10100, and generates image data for displaying a captured intracorporeal image on the display device. As the image processing, various types of signal processing, for example, development processing (demosaic processing), high image quality processing (band emphasis processing, super-resolution processing, noise reduction (NR) processing, image stabilization processing, and/or the like), magnification processing (electronic zoom processing), and/or the like, can be performed. The external control device 10200 controls the drive of the display device to display the captured intracorporeal image on the basis of the generated image data. Alternatively, the external control device 10200 may cause the generated image data to be recorded in a recording device (not illustrated) or to be printed and output by a printing device (not illustrated).

<Example of Utilization in Endoscopic Surgery System>

The technology according to the present disclosure can be utilized in a variety of products. For example, the technology according to the present disclosure may be applied to an endoscopic surgery system.

Figure 25:
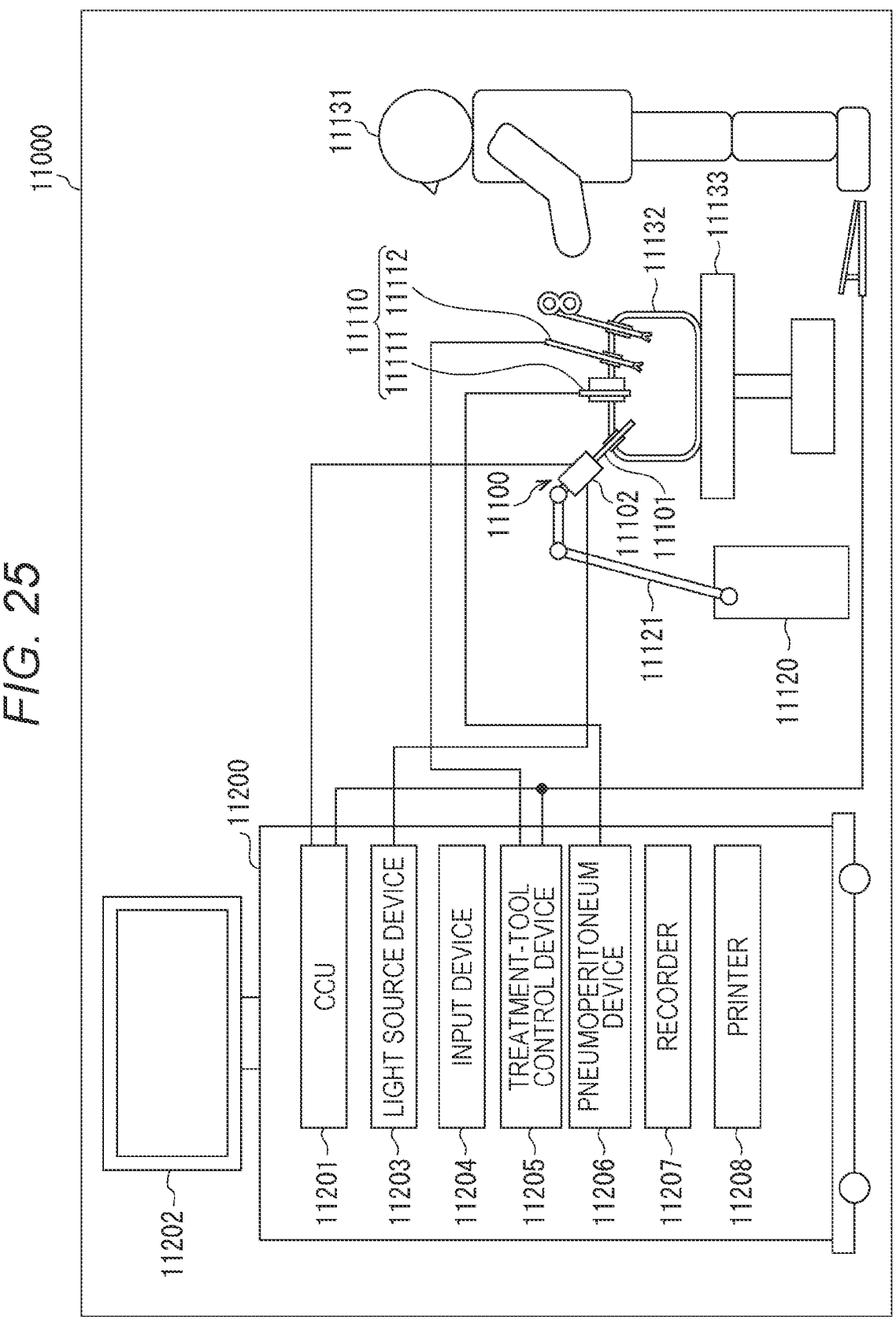
FIG. 25 is a diagram illustrating an example of a schematic configuration of an endoscopic surgery system.

FIG. 25 is a diagram illustrating an example of a schematic configuration of an endoscopic surgery system to which the technology according to the present disclosure (the present technology) can be applied.

FIG. 25 illustrates a state where a surgical operator (a surgeon) 11131 is performing surgery on a patient 11132 on a patient bed 11133, by using an endoscopic surgery system 11000. As illustrated, the endoscopic surgery system 11000 includes an endoscope 11100, another surgical instrument 11110 such as a pneumoperitoneum tube 11111 or an energy treatment tool 11112, a support arm device 11120 that supports the endoscope 11100, and a cart 11200 that is mounted with various devices for endoscopic surgery.

The endoscope 11100 includes a lens barrel 11101 for which a region having a predetermined length from a distal end is inserted into a body cavity of the patient 11132, and a camera head 11102 that is connected to a base end of the lens barrel 11101. The illustrated example indicates an endoscope 11100 that is configured as what is called a rigid scope including a rigid lens barrel 11101, but the endoscope 11100 may be configured as what is called a soft scope including a soft lens barrel.

At the distal end of the lens barrel 11101, an opening into which an objective is fitted is provided. The endoscope 11100 is connected to a light source device 11203, and light generated by the light source device 11203 is guided to the distal end of the lens barrel 11101 by a light guide that extends inside the lens barrel 11101, and is applied via the objective toward an observation target in the body cavity of the patient 11132. Note that the endoscope 11100 may be a forward-viewing endoscope, or may be an oblique-viewing endoscope or a side-viewing endoscope.

Inside the camera head 11102, an optical system and an imaging element are provided, and reflected light (observation light) from the observation target is condensed into the imaging element by the optical system. The imaging element performs optical-to-electrical conversion on the observation light, and an electric signal that corresponds to the observation light, that is, an image signal that corresponds to an observation image, is generated. The image signal is transmitted as raw data to a camera control unit (CCU) 11201.

The CCU 11201 includes a central processing unit (CPU), a graphics processing unit (GPU), or the like, and integrally controls operations of the endoscope 11100 and a display device 11202. Moreover, the CCU 11201 receives the image signal from the camera head 11102, and performs, on the image signal, various types of image processing for displaying an image based on the image signal, such as development processing (demosaic processing), for example.

Under the control of the CCU 11201, the display device 11202 displays an image based on the image signal on which image processing has been performed by the CCU 11201.

The light source device 11203 includes a light source such as a light emitting diode (LED), for example, and supplies the endoscope 11100 with irradiation light in imaging a surgical site or the like.

An input device 11204 is an input interface to the endoscopic surgery system 11000. A user can input various types of information or an instruction to the endoscopic surgery system 11000 via the input device 11204. For example, a user inputs an instruction to change imaging conditions (the type of irradiation light, magnification, a focal length, and the like) of the endoscope 11100, or the like.

A treatment-tool control device 11205 controls the drive of the energy treatment tool 11112 for cauterization of tissue, incision, sealing of a blood vessel, or the like. A pneumoperitoneum device 11206 feeds gas into the body cavity via the pneumoperitoneum tube 11111 in order to expand the body cavity of the patient 11132 for the purpose of securing a field of view of the endoscope 11100 and securing a working space of the surgical operator. A recorder 11207 is a device that can record various types of information relating to surgery. A printer 11208 is a device that can print various types of information relating to surgery in various forms such as text, an image, or a graph.

Note that the light source device 11203 that supplies the endoscope 11100 with irradiation light in imaging a surgical site can include a white light source that includes, for example, an LED, a laser light source, or a combination of the LED and the laser light source. In a case where the white light source includes a combination of RGB laser light sources, an output intensity and an output timing of each color (each wavelength) can be controlled with high precision, and therefore the white balance of a captured image can be adjusted in the light source device 11203. Furthermore, in this case, by irradiating an observation target with a laser beam from each of the RGB laser light sources in a time-division manner and controlling the drive of the imaging element of the camera head 11102 in synchronization with a timing of irradiation, an image that corresponds to each of RGB can be captured in a time-division manner. By employing this method, a color image can be obtained without providing a color filter in the imaging element.

Furthermore, the drive of the light source device 11203 may be controlled to change the intensity of output light every predetermined time period. By controlling the drive of the imaging element of the camera head 11102 in synchronization with a timing of a change in the intensity of light, acquiring images in a time-division manner, and combining the images, an image in a high dynamic range without what are called blocked-up shadows and blown-out highlights can be generated.

Furthermore, the light source device 11203 may be configured to be able to supply light in a predetermined wavelength band that corresponds to special light observation. In special light observation, for example, what is called narrow band imaging is performed in which a predetermined tissue such as a blood vessel of a mucous membrane surface layer is imaged with high contrast, by applying light in a band that is narrower than a band of irradiation light in normal observation (namely, white light) by using the wavelength dependency of absorption of light in body tissue. Alternatively, in special light observation, fluorescence observation in which an image is obtained by using fluorescence that is generated due to irradiation with excitation light may be performed. In fluorescence observation, for example, fluorescence from body tissue can be observed by irradiating the body tissue with excitation light (autofluorescence observation), or a fluorescent image can be obtained by injecting a reagent of indocyanine green (ICG) or the like into body tissue and irradiating the body tissue with excitation light that corresponds to a fluorescent wavelength of the reagent. The light source device 11203 can be configured to be able to supply narrow-band light and/or excitation light that corresponds to such special light observation.

Figure 26:
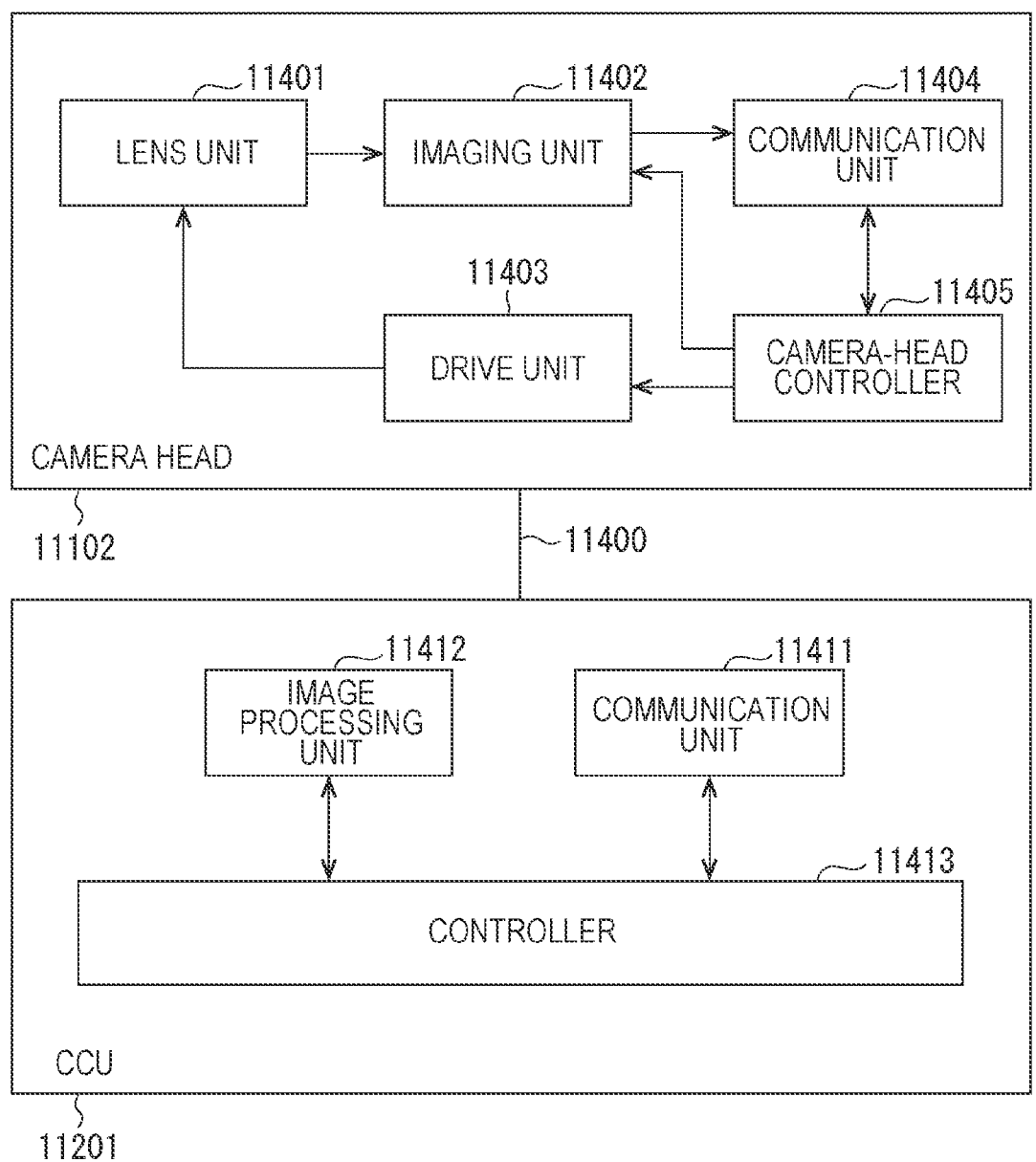
FIG. 26 is a block diagram illustrating an example of functional configurations of a camera head and a CCU.

FIG. 26 is a block diagram illustrating an example of functional configurations of the camera head 11102 and the CCU 11201 that are illustrated in FIG. 25.

The camera head 11102 includes a lens unit 11401, an imaging unit 11402, a drive unit 11403, a communication unit 11404, and a camera-head controller 11405. The CCU 11201 includes a communication unit 11411, an image processing unit 11412, and a controller 11413. The camera head 11102 and the CCU 11201 are communicably connected to each other by a transmission cable 11400.

The lens unit 11401 is an optical system that is provided in a part connected to the lens barrel 11101. Observation light that has been taken in from the distal end of the lens barrel 11101 is guided to the camera head 11102, and enters the lens unit 11401. The lens unit 11401 includes a combination of a plurality of lenses including a zoom lens and a focus lens.

The imaging unit 11402 includes an imaging element. The imaging unit 11402 may include one imaging element (what is called a single plate type), or may include a plurality of imaging elements (what is called a multiplate type). In a case where the imaging unit 11402 is configured in a multiplate type, for example, a color image may be obtained by generating image signals that respectively correspond to RGB by using respective imaging elements and combining the image signals. Alternatively, the imaging unit 11402 may include a pair of imaging elements that respectively acquire image signals for the right eye and the left eye that correspond to a three-dimensional (3D) display. By conducting a 3D display, the surgical operator 11131 can more accurately grasp the depth of biotissue in a surgical site. Note that, in a case where the imaging unit 11402 is configured in a multiplate type, a plurality of lens units 11401 can also be provided to correspond to respective imaging elements.

Furthermore, the imaging unit 11402 does not always need to be provided in the camera head 11102. For example, the imaging unit 11402 may be provided right behind an objective inside the lens barrel 11101.

The drive unit 11403 includes an actuator, and moves the zoom lens and the focus lens of the lens unit 11401 by a predetermined length along an optical axis under the control of the camera-head controller 11405. By doing this, a magnification and a focus of an image captured by the imaging unit 11402 can be appropriately adjusted.

The communication unit 11404 includes a communication device that transmits or receives various types of information to or from the CCU 11201. The communication unit 11404 transmits the image signal obtained from the imaging unit 11402 as raw data to the CCU 11201 via the transmission cable 11400.

Furthermore, the communication unit 11404 receives, from the CCU 11201, a control signal for controlling the drive of the camera head 11102, and supplies the control signal to the camera-head controller 11405. The control signal includes information relating to imaging conditions, for example, information indicating that a frame rate of a captured image will be designated, information indicating that an exposure value in imaging will be designated, information indicating that a magnification and a focus of the captured image will be designated, and/or other information.

Note that the imaging conditions described above, such as a frame rate, an exposure value, magnification, or a focus, may be appropriately designated by a user, or may be automatically set on the basis of an acquired image signal by the controller 11413 of the CCU 11201. In the latter case, what are called an auto exposure (AE) function, an auto focus (AF) function, and an auto white balance (AWB) function are mounted in the endoscope 11100.

The camera-head controller 11405 controls the drive of the camera head 11102 on the basis of the control signal that has been received from the CCU 11201 via the communication unit 11404.

The communication unit 11411 includes a communication device that transmits or receives various types of information to or from the camera head 11102. The communication unit 11411 receives an image signal that has been transmitted from the camera head 11102 via the transmission cable 11400.

Furthermore, the communication unit 11411 transmits, to the camera head 11102, a control signal for controlling the drive of the camera head 11102. The image signal or the control signal can be transmitted in telecommunication, optical communication, or the like.

The image processing unit 11412 performs various types of image processing on an image signal that has been transmitted from the camera head 11102 and serves as raw data.

The controller 11413 performs various types of control relating to the imaging of a surgical site or the like by using the endoscope 11100 and a display of a captured image obtained in the imaging of the surgical site or the like. For example, the controller 11413 generates a control signal for controlling the drive of the camera head 11102.

Furthermore, the controller 11413 causes the display device 11202 to display a captured image indicating a surgical site or the like, on the basis of an image signal on which image processing has been performed by the image processing unit 11412. At this time, the controller 11413 may recognize various objects in the captured image by using various types of image recognition technology. For example, the controller 11413 can recognize a surgical instrument such as forceps, a specified region of a living body, bleeding, mist in the use of the energy treatment tool 11112, or the like by detecting the shape of an edge, color, or the like of an object included in the captured image. When the controller 11413 causes the display device 11202 to display the captured image, the controller 11413 may cause a display to be conducted in such a way that various types of surgery assistance information are superimposed onto the image indicating the surgical site, by using a result of recognition. By superimposing and displaying surgery assistance information and presenting the surgery assistance information to the surgical operator 11131, a burden imposed on the surgical operator 11131 can be reduced, and the surgical operator 11131 can reliably advance surgery.

The transmission cable 11400 that connects the camera head 11102 and the CCU 11201 is an electric signal cable that corresponds to communication of electric signals, an optical fiber that corresponds to optical communication, or a composite cable of the electric signal cable and the optical fiber.

Here, in the illustrated example, communication is performed by wire by using the transmission cable 11400, but communication between the camera head 11102 and the CCU 11201 may be performed wirelessly.

Note that the endoscopic surgery system has been described as an example here, but the technology according to the present disclosure may also be applied to another system such as a microscopic surgery system, for example.

<Example of Utilization in Moving Body>

The technology according to the present disclosure can be utilized in a variety of products. For example, the technology according to the present disclosure may be implemented, for example, as an apparatus that is mounted in any type of moving body of an automobile, an electric automobile, a hybrid electric automobile, a motorcycle, a bicycle, a personal mobility, an airplane, a drone, a ship, a robot, or the like.

Figure 27:
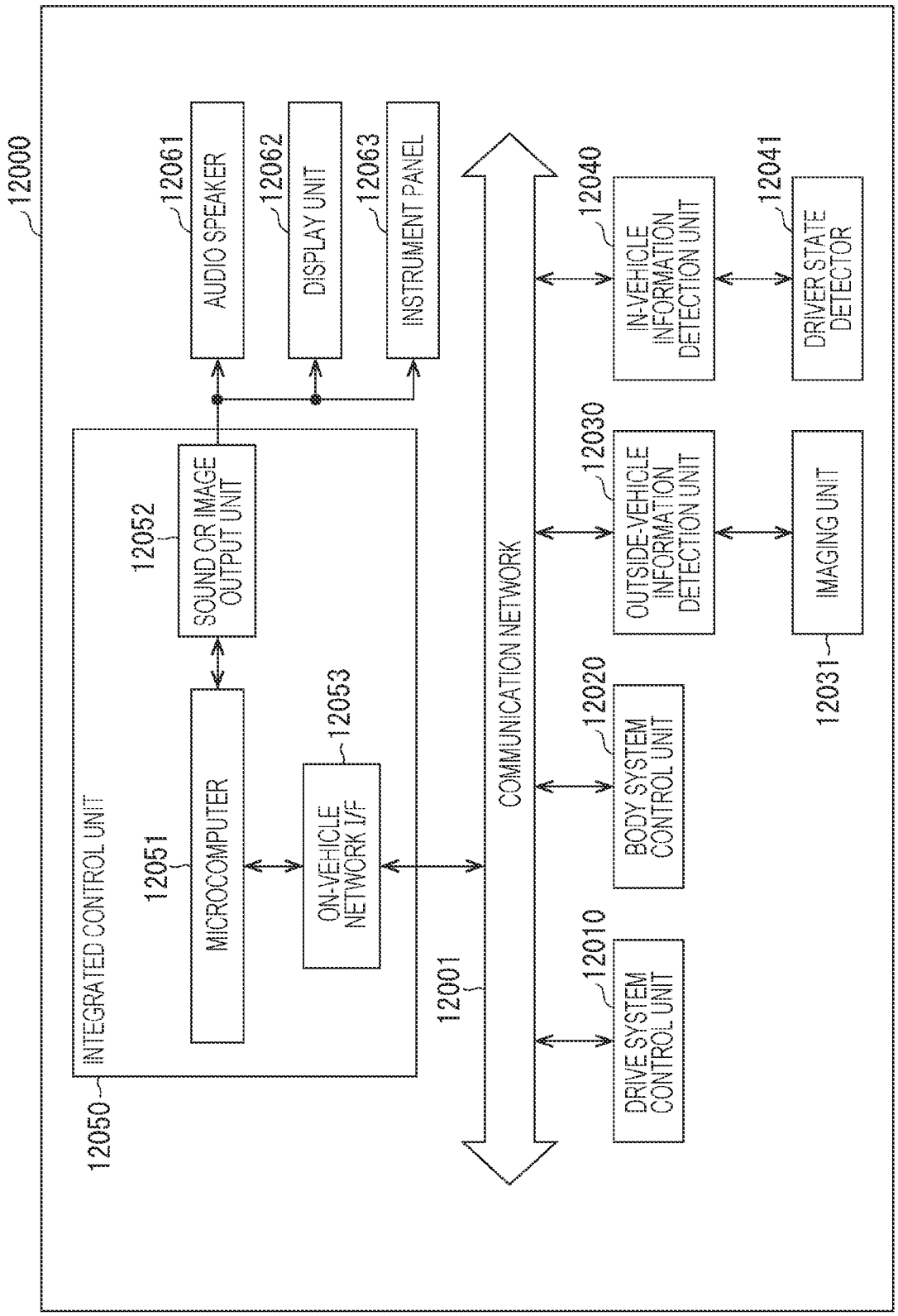
FIG. 27 is a block diagram illustrating an example of a schematic configuration of a vehicle control system.

FIG. 27 is a block diagram illustrating a schematic configuration example of a vehicle control system that is an example of a moving body control system to which the technology according to the present disclosure can be applied.

A vehicle control system 12000 includes a plurality of electronic control units that is connected via a communication network 12001. In the example illustrated in FIG. 27, the vehicle control system 12000 includes a drive system control unit 12010, a body system control unit 12020, an outside-vehicle information detection unit 12030, an in-vehicle information detection unit 12040, and an integrated control unit 12050. Furthermore, as a functional configuration of the integrated control unit 12050, a microcomputer 12051, a sound or image output unit 12052, and an on-vehicle network interface (I/F) 12053 are illustrated.

The drive system control unit 12010 controls an operation of a device that relates to a drive system of a vehicle in accordance with various programs. For example, the drive system control unit 12010 functions as a control device of a drive force generation device that generates a drive force of a vehicle, such as an internal combustion engine or a drive motor, a drive force transmission mechanism that transmits the drive force to wheels, a steering mechanism that adjusts a steering angle of the vehicle, a braking device that generates a braking force of the vehicle, and the like.

The body system control unit 12020 controls the operations of various devices equipped in a vehicle body in accordance with various programs. For example, the body system control unit 12020 functions as a control device of a keyless entry system, a smart key system, a power window device, or various lamps such as a headlamp, a back lamp, a brake lamp, a turn signal, or a fog lamp. In this case, radio waves transmitted from a portable machine that is substituted for a key or signals of various switches can be input to the body system control unit 12020. The body system control unit 12020 receives an input of these radio waves or signals, and controls a door locking device, the power window device, a lamp, or the like of the vehicle.

The outside-vehicle information detection unit 12030 detects information relating to the outside of a vehicle in which the vehicle control system 12000 is mounted. For example, the outside-vehicle information detection unit 12030 is connected to an imaging unit 12031. The outside-vehicle information detection unit 12030 causes the imaging unit 12031 to capture an image of the outside of the vehicle, and receives the captured image. The outside-vehicle information detection unit 12030 may perform object detection processing or distance detection processing on a person, a car, an obstacle, a traffic sign, characters on a road surface, or the like on the basis of the received image.

The imaging unit 12031 is an optical sensor that receives light and outputs an electric signal that corresponds to an amount of the received light. The imaging unit 12031 can output the electric signal as an image, or can output the electric signal as information of ranging. Furthermore, the light received by the imaging unit 12031 may be visible light, or may be invisible light such as infrared light.

The in-vehicle information detection unit 12040 detects in-vehicle information. The in-vehicle information detection unit 12040 is connected, for example, to a driver state detector 12041 that detects a state of a driver. The driver state detector 12041 includes, for example, a camera that images a driver, and the in-vehicle information detection unit 12040 may calculate a fatigue degree or a concentration degree of the driver or may determine whether or not the driver is dozing on the basis of detection information that has been input from the driver state detector 12041.

The microcomputer 12051 can calculate a control target value of the drive force generation device, the steering mechanism, or the braking device on the basis of in-vehicle or outside-vehicle information acquired by the outside-vehicle information detection unit 12030 or the in-vehicle information detection unit 12040, and can output a control command to the drive system control unit 12010. For example, the microcomputer 12051 can perform cooperative control aiming at implementing a function of an advanced driver assistance system (ADAS) including vehicle collision avoidance or impact mitigation, follow-up traveling based on a distance between vehicles, vehicle speed maintaining traveling, vehicle collision warning, vehicle lane departure warning, or the like.

Furthermore, the microcomputer 12051 can perform cooperative control aiming at automatic driving for autonomously traveling independently of a driver's operation, or the like, by controlling the drive force generation device, the steering mechanism, the braking device, or the like on the basis of information relating to the periphery of the vehicle that has been acquired by the outside-vehicle information detection unit 12030 or the in-vehicle information detection unit 12040.

Furthermore, the microcomputer 12051 can output a control command to the body system control unit 12020 on the basis of outside-vehicle information acquired by the outside-vehicle information detection unit 12030. For example, the microcomputer 12051 can perform cooperative control aiming at antiglare, such as controlling a headlamp in accordance with a position of a preceding vehicle or an oncoming vehicle that has been sensed by the outside-vehicle information detection unit 12030, and switching a high beam to a low beam.

The sound or image output unit 12052 transmits an output signal of at least one of sound or an image to an output device that can visually or aurally report information to a passenger of a vehicle or the outside of the vehicle. In the example of FIG. 27, an audio speaker 12061, a display unit 12062, and an instrument panel 12063 are illustrated as the output device. The display unit 12062 may include, for example, at least one of an on-board display or a head-up display.

Figure 28:
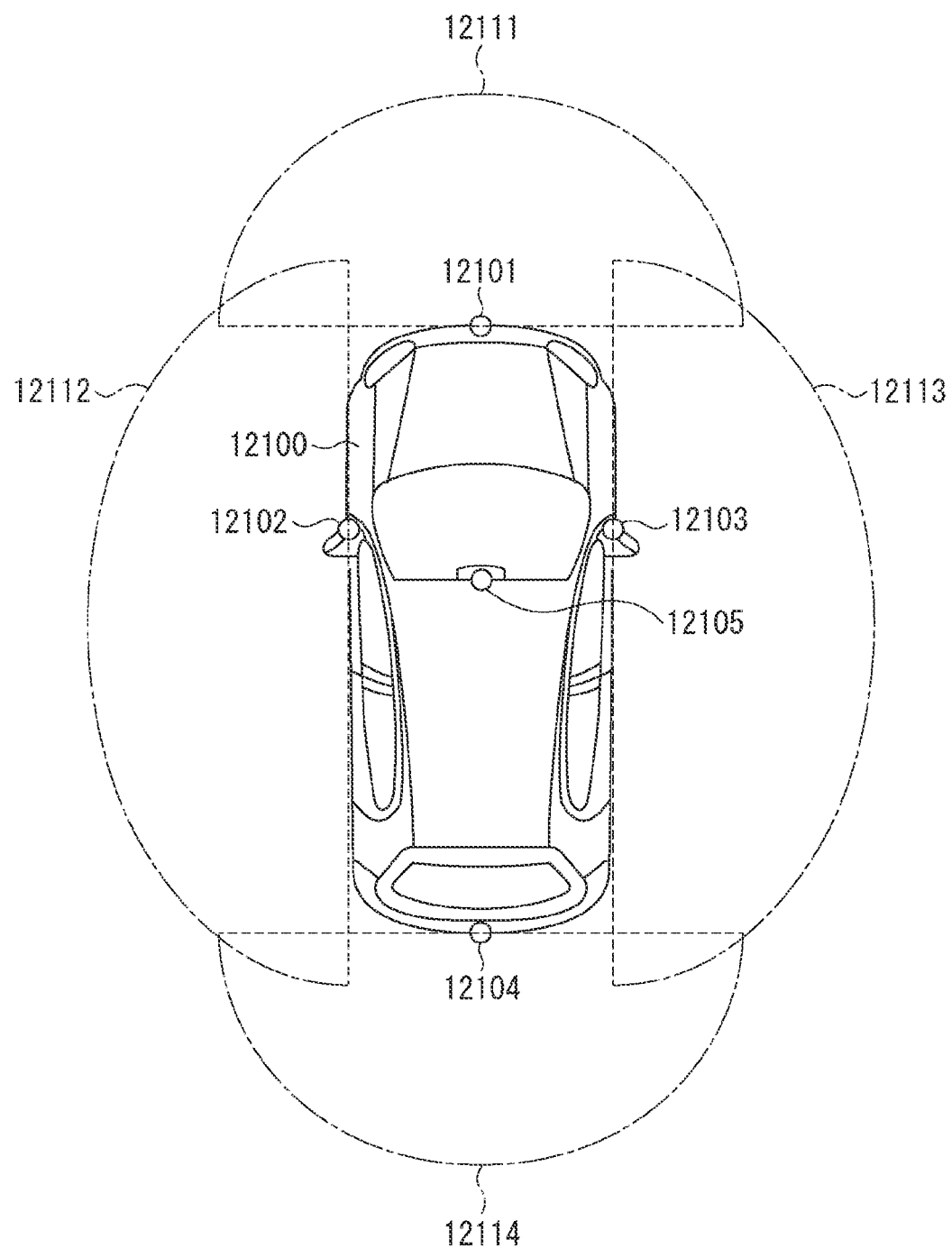
FIG. 28 is an explanatory diagram illustrating an example of the installation positions of an outside-vehicle information detector and an imaging unit.

FIG. 28 is a diagram illustrating an example of an installation position of the imaging unit 12031.

In FIG. 28, a vehicle 12100 includes, as the imaging unit 12031, imaging units 12101, 12102, 12103, 12104, and 12105.

The imaging units 12101, 12102, 12103, 12104, and 12105 are provided in positions, for example, a front nose, a side-view mirror, a rear bumper, a back door, an upper portion of a windshield in a vehicle cabin, and the like of the vehicle 12100. The imaging unit 12101 equipped in the front nose and the imaging unit 12105 equipped in the upper portion of the windshield in the vehicle cabin principally acquire an image of a front side of the vehicle 12100. The imaging units 12102 and 12103 equipped in the side-view mirrors principally acquire images of sides of the vehicle 12100. The imaging unit 12104 equipped in the rear bumper or the back door principally acquires an image of a rear side of the vehicle 12100. The images of the front side that have been acquired by the imaging units 12101 and 12105 are principally used to detect a preceding vehicle, or a pedestrian, an obstacle, a traffic light, a traffic sign, a traffic lane, or the like.

Note that FIG. 28 illustrates examples of imaging ranges of the imaging units 12101 to 12104. An imaging range 12111 indicates an imaging range of the imaging unit 12101 provided in the front nose, imaging ranges 12112 and 12113 respectively indicate imaging ranges of the imaging units 12102 and 12103 provided in the side-view mirrors, and an imaging range 12114 indicates an imaging range of the imaging unit 12104 provided in the rear bumper or the back door. For example, an overhead image in which the vehicle 12100 is viewed from the above is obtained by superimposing pieces of image data that have been captured by the imaging units 12101 to 12104 onto each other.

At least one of the imaging units 12101 to 12104 may have a function of acquiring distance information. For example, at least one of the imaging units 12101 to 12104 may be a stereo camera including a plurality of imaging elements, or may be an imaging element including pixels for the detection of a phase difference.

For example, the microcomputer 12051 can obtain a distance to each three-dimensional object in the imaging ranges 12111 to 12114 and a temporal change in this distance (a relative speed with respect to the vehicle 12100) on the basis of the distance information obtained from the imaging units 12101 to 12104 to extract, as a preceding vehicle, in particular, a three-dimensional object that is located closest on an advancing route of the vehicle 12100 and travels at a predetermined speed (for example, 0 km/h or more) in substantially the same direction as a direction of the vehicle 12100. Moreover, the microcomputer 12051 can set, in advance, a distance between vehicles to be secured in front of the preceding vehicle, and can perform automatic braking control (including follow-up stop control), automatic acceleration control (including follow-up starting control), and the like. As described above, cooperative control that aims at automatic driving for autonomously traveling independently of a driver's operation, or the like can be performed.

For example, the microcomputer 12051 can classify pieces of three-dimensional data relating to three-dimensional objects into a motorcycle, an ordinary vehicle, a large vehicle, a pedestrian, and another three-dimensional object such as a telegraph pole on the basis of the distance information obtained from the imaging units 12101 to 12104 to extract the pieces of three-dimensional data, and can use the pieces of three-dimensional data to automatically avoid an obstacle. For example, the microcomputer 12051 identifies obstacles around the vehicle 12100 to divide the obstacles into obstacles that a driver of the vehicle 12100 can visually recognize and obstacles that are difficult for the driver to visually recognize. Then, the microcomputer 12051 determines a collision risk indicating a risk degree of collision against each of the obstacles. In a situation where the collision risk is greater than or equal to a setting value and there is a possibility of collision, the microcomputer 12051 outputs an alarm to the driver via the audio speaker 12061 or the display unit 12062, or performs forced deceleration or avoidance steering via the drive system control unit 12010, and this enables driving assistance for collision avoidance.

At least one of the imaging units 12101 to 12104 may be an infrared camera that detects infrared rays. For example, the microcomputer 12051 can recognize a pedestrian by determining whether or not the pedestrian is present in images captured by the imaging units 12101 to 12104. Such recognition of a pedestrian is performed, for example, in a procedure of extracting feature points in images captured by the imaging units 12101 to 12104 serving as infrared cameras and a procedure of performing pattern matching processing on consecutive feature points indicating the contour of an object and determining whether or not the consecutive feature points indicate a pedestrian. When the microcomputer 12051 determines that a pedestrian is present in the images captured by the imaging units 12101 to 12104, and recognizes the pedestrian, the sound or image output unit 12052 causes the display unit 12062 to conduct a display in such a way that a rectangular contour line for emphasis is superimposed onto the recognized pedestrian. Furthermore, the sound or image output unit 12052 may causes the display unit 12062 to display, in a desired position, an icon or the like that indicates the pedestrian.

Note that herein a system refers to the entirety of an apparatus that includes a plurality of devices.

Note that the effects described herein are only illustrative and are not restrictive, and other effects may be exhibited.

Note that embodiments according to the present technology are not limited to the embodiments described above, and various changes can be made without departing from the gist of the present technology.

Note that the present technology can also employ the configurations described below.

(1)

An imaging apparatus including:

pixel circuits that each output an electric charge signal generated by receiving incident light and performing optical-to-electrical conversion on the incident light;

an AD converter that compares the electric charge signal with a reference signal for each of the pixel circuits, and outputs, as a conversion result, a code input signal at a time when a comparison result has been inverted;

an encoding unit that encodes the conversion result from the AD converter;

a holding unit that holds the encoding result; and an output unit that outputs the encoding result held by the holding unit, in which the pixel circuits are disposed in a first substrate, and the AD converter is disposed in a second substrate that is stacked in a lower layer of the first substrate.

(2)

The imaging apparatus described in (1) described above, in which the encoding unit, the holding unit, and the output unit are disposed in the second substrate.

(3)

The imaging apparatus described in (1) described above, in which the output unit is disposed in the first substrate, and the encoding unit and the holding unit are disposed in the second substrate.

(4)

The imaging apparatus described in (1) described above, in which the encoding unit, the holding unit, and the output unit are disposed in a third substrate that is stacked in a lower layer of the second substrate.

(5)

The imaging apparatus described in any of (1) to (4) described above, further including:

a decoding unit that decodes the encoding result held by the holding unit, in which the decoding unit is included in a substrate that is identical to a substrate of the encoding unit.

(6)

The imaging apparatus described in (5) described above, in which the decoding unit decodes the code input signal of a reset level of each of the pixel circuits, and the output unit performs correlated double sampling (CDS) by using the code input signal of the reset level, the code input signal being decoded by the decoding unit, and the code input signal of a signal level of each of the pixel circuits, and outputs a CDS result.

(7)

The imaging apparatus described in (6) described above, in which the CDS result that has been output from the output unit is encoded by the encoding unit, and is held by the holding unit.

(8)

The imaging apparatus described in (7) described above, in which the encoding result held by the holding unit is decoded by the decoding unit, and is output by the output unit.

(9)

An electronic device including:

an imaging apparatus including:

pixel circuits that each output an electric charge signal generated by receiving incident light and performing optical-to-electrical conversion on the incident light;

an AD converter that compares the electric charge signal with a reference signal for each of the pixel circuits, and outputs, as a conversion result, a code input signal at a time when a comparison result has been inverted;

an encoding unit that encodes the conversion result from the AD converter;

a holding unit that holds the encoding result; and an output unit that outputs the encoding result held by the holding unit, in which the pixel circuits are disposed in a first substrate, and the AD converter is disposed in a second substrate that is stacked in a lower layer of the first substrate; and a processing unit that processes a signal from the imaging apparatus.

(10)

An imaging apparatus including:

pixel circuits that each output an electric charge signal generated by receiving incident light and performing optical-to-electrical conversion on the incident light;

an AD converter that compares the electric charge signal with a reference signal for each of the pixel circuits, and outputs, as a conversion result, a code input signal at a time when a comparison result has been inverted;

a holding unit that holds the conversion result from the AD converter; and an output unit that outputs the conversion result held by the holding unit, in which the pixel circuits, and the holding unit or the output unit are disposed in a first substrate, and the AD converter is disposed in a second substrate that is stacked in a lower layer of the first substrate.

(11)

An imaging apparatus including:

pixel circuits that each output an electric charge signal generated by receiving incident light and performing optical-to-electrical conversion on the incident light;

an AD converter that compares the electric charge signal with a reference signal for each of the pixel circuits, and outputs, as a conversion result, a code input signal at a time when a comparison result has been inverted;

a holding unit that holds the conversion result from the AD converter; and an output unit that outputs the conversion result held by the holding unit, in which the pixel circuits are disposed in a first substrate, the AD converter is disposed in a second substrate that is stacked in a lower layer of the first substrate, and the holding unit and the output unit are disposed in a third substrate that is stacked in a lower layer of the second substrate.

(12)

The imaging apparatus described in (10) or (11) described above, in which the output unit performs correlated double sampling (CDS), and outputs a result.

REFERENCE SIGNS LIST

1 Imaging apparatus
11 Semiconductor substrate
21 Pixel
22 Pixel array
23 Pixel drive circuit
25 Vertical drive circuit
26 Sense amplifier
27 Output unit
28 Timing generation circuit
41 Pixel circuit
51 Comparator
52 Latch storage
101 Photodiode
102 Discharge transistor
103 Transfer transistor
104 Reset transistor
105 Floating diffusion
106 Amplification transistor
201 Pixel chip
202 Logic chip
203 Logic chip
211 Pixel area
212 Pixel bias
221 Signal processing unit
222 Frame memory
223 Data processing unit
224 Controller
301 Encoder unit
302 Decoding unit
352 Decoding unit

The invention claimed is:

1. An imaging apparatus comprising:
pixel circuits that each output an electric charge signal generated by receiving incident light and performing optical-to-electrical conversion on the incident light;
an AD converter that compares the electric charge signal with a reference signal for each of the pixel circuits, and outputs, as a conversion result, a code input signal at a time when a comparison result has been inverted;
an encoder that encodes the conversion result from the AD converter;
a memory that holds the encoding result; and
an output circuit that outputs the encoding result held by the memory; and
a decoder that decodes the encoding result held by the memory, wherein
the pixel circuits are disposed in a first substrate, the AD converter, the encoder and the decoder are disposed in a second substrate that is stacked in a lower layer than the first substrate,
the decoder decodes the code input signal of a reset level of each of the pixel circuits, and
the output circuit performs correlated double sampling (CDS) by using the code input signal of the reset level, the code input signal being decoded by the decoder, and the code input signal of a signal level of each of the pixel circuits, and outputs a CDS result.

2. The imaging apparatus according to claim 1, wherein the memory and the output circuit are disposed in the second substrate.

3. The imaging apparatus according to claim 1, wherein the output circuit is disposed in the first substrate, and
the memory is disposed in the second substrate.

4. The imaging apparatus according to claim 1, wherein the memory and the output circuit are disposed in a third substrate that is stacked in a lower layer than the second substrate.

5. The imaging apparatus according to claim 1, wherein the CDS result that has been output from the output circuit is encoded by the encoder, and is held by the memory.

6. The imaging apparatus according to claim 5, wherein the encoding result held by the memory is decoded by the decoder, and is output by the output circuit.

7. An electronic device comprising the imaging apparatus according to claim 1.

8. The electronic device according to claim 7, wherein the memory and the output circuit are disposed in the second substrate.

9. The electronic device according to claim 7, wherein the output circuit is disposed in the first substrate, and
the memory is disposed in the second substrate.

10. The electronic device according to claim 7, wherein the memory and the output circuit are disposed in a third substrate that is stacked in a lower layer than the second substrate.

11. The electronic device according to claim 7, wherein the CDS result that has been output from the output circuit is encoded by the encoder, and is held by the memory.

12. The electronic device according to claim 11, wherein the encoding result held by the memory is decoded by the decoder, and is output by the output circuit.

* * * * *